US012033966B2

(12) United States Patent
Chen et al.

(10) Patent No.: US 12,033,966 B2
(45) Date of Patent: Jul. 9, 2024

(54) CONTACT PADS OF THREE-DIMENSIONAL MEMORY DEVICE AND FABRICATION METHOD THEREOF

(71) Applicant: Yangtze Memory Technologies Co., Ltd., Wuhan (CN)

(72) Inventors: He Chen, Wuhan (CN); Liang Xiao, Wuhan (CN); Yongqing Wang, Wuhan (CN); Shu Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 500 days.

(21) Appl. No.: 17/249,222

(22) Filed: Feb. 24, 2021

(65) Prior Publication Data

US 2022/0208705 A1 Jun. 30, 2022

Related U.S. Application Data

(63) Continuation of application No. PCT/CN2020/138790, filed on Dec. 24, 2020.

(51) Int. Cl.
*H01L 23/00* (2006.01)
*H01L 25/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC . H01L 2224/08058; H01L 2224/08145; H01L 2224/09517; H01L 2224/80895;
(Continued)

(56) References Cited

U.S. PATENT DOCUMENTS 10,283,493 B1 5/2019 Nishida
10,600,763 B1 * 3/2020 Xiao .................. H01L 21/8221
(Continued)

FOREIGN PATENT DOCUMENTS

CN 109155320 A * 1/2019 .......... H01L 27/1157
CN 109155320 A 1/2019
(Continued)

OTHER PUBLICATIONS

Written Search Report for PCT/CN2020/138790 (Year: 2022).*
(Continued)

*Primary Examiner* — Telly D Green
(74) *Attorney, Agent, or Firm* — Anova Law Group, PLLC

(57) ABSTRACT

Three-dimensional (3D) NAND memory devices and methods are provided. In one aspect, a fabrication method includes preparing a stacked device having a first array device and a second array device, forming an opening on a back side of the second array device, and forming one or more contact pads in the opening. The first array device includes first front pads on a face side of the first array device and first back pads on a back side of the first array device. The second array device includes second front pads on a face side of the second array device and bonded with the first back pads. The one or more contact pads are disposed at a level proximate to the second front pads with respect to the first array device.

17 Claims, 19 Drawing Sheets

(51) Int. Cl.
  *H01L 25/065* (2023.01)
  *H10B 41/27* (2023.01)
  *H10B 43/27* (2023.01)
(52) U.S. Cl.
  CPC .............. *H01L 25/50* (2013.01); *H10B 41/27* (2023.02); *H10B 43/27* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
  CPC . H01L 2224/80896; H01L 2225/06527; H01L 2225/06541; H01L 24/08; H01L 24/80; H01L 25/0657; H01L 25/50; H01L 2924/1431; H01L 2924/14511; H10B 41/27; H10B 43/27; H10B 43/40
  See application file for complete search history.

(56) References Cited

U.S. PATENT DOCUMENTS

| | | | | |
|---|---|---|---|---|
| 10,600,781 | B1* | 3/2020 | Xiao | ........................ G11C 5/06 |
| 10,636,813 | B1* | 4/2020 | Xiao | ................ H01L 21/02598 |
| 10,734,400 | B1 | 8/2020 | Fukuo et al. | |
| 11,322,483 | B1* | 5/2022 | Ogawa | .................... H01L 25/50 |
| 2016/0086967 | A1 | 3/2016 | Lee et al. | |
| 2017/0236746 | A1 | 8/2017 | Yu et al. | |
| 2018/0219038 | A1* | 8/2018 | Gambino | .......... H01L 27/14618 |
| 2018/0277497 | A1 | 9/2018 | Matsuo | |
| 2019/0057959 | A1* | 2/2019 | Or-Bach | ............... H01L 23/481 |
| 2019/0221557 | A1 | 7/2019 | Kim et al. | |
| 2020/0058669 | A1 | 2/2020 | Chen et al. | |
| 2020/0194452 | A1* | 6/2020 | Xiao | ................... H01L 23/5226 |
| 2020/0203364 | A1 | 6/2020 | Totoki et al. | |
| 2020/0266206 | A1 | 8/2020 | Fukuo et al. | |
| 2020/0286905 | A1 | 9/2020 | Kai et al. | |
| 2021/0104472 | A1* | 4/2021 | Shimamoto | ............ H10B 43/35 |
| 2021/0265377 | A1* | 8/2021 | Chen | ..................... H10B 43/27 |

FOREIGN PATENT DOCUMENTS

| | | |
|---|---|---|
| CN | 110574162 A | 12/2019 |
| CN | 111316440 A | 6/2020 |
| CN | 111971795 A | 11/2020 |
| JP | 2014022729 A | 2/2014 |
| JP | 2018152419 A | 9/2018 |
| TW | 202002255 A | 1/2020 |
| TW | 202010052 A | 3/2020 |
| TW | 202042376 A | 11/2020 |

OTHER PUBLICATIONS

The World Intellectual Property Organization (WIPO) International Search Report for PCT/CN2020/138790 dated Sep. 27, 2021 4 pages.

* cited by examiner

CONTACT PADS OF THREE-DIMENSIONAL MEMORY DEVICE AND FABRICATION METHOD THEREOF

CROSS-REFERENCE TO RELATED APPLICATION

This application claims the priority to PCT Patent Application No. PCT/CN2020/138790 filed on Dec. 24, 2020, the entire content of which is incorporated herein by reference.

FIELD OF THE TECHNOLOGY

This application relates to the field of semiconductor technology and, specifically, to a three-dimensional (3D) memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers on a single die to achieve higher density, higher capacity, faster performance, lower power consumption, and better cost efficiency.

A 3D NAND memory device can include a peripheral device, a first array device, and a second array device that are stacked together. For example, the peripheral device can be arranged at the bottom of the stack and the second array device can be arranged on the top. Contact pads, where bonding wires are bonded, can be formed on the second array device. Contacts can be formed in the first and second array devices to connect the contact pads to the peripheral device. The contacts in the first and second array devices, however, may cause parasitic capacitance that may affect the high-speed operation of the 3D NAND memory device. Additionally, the first and second array devices often contain a polycrystalline silicon (polysilicon) layer that needs hydrogen to repair crystallographic defects. The polysilicon layer of the second array device is close to the top of the stack, and may receive enough hydrogen for defect repair. But the polysilicon layer of the first array device, disposed beneath the second array structure, may not receive enough hydrogen for defect repair. The disclosed devices and methods are directed to solve one or more problems set forth above and other problems.

SUMMARY

In one aspect of the present disclosure, a fabrication method for a 3D memory device includes preparing a stacked device having a first array device and a second array device, forming an opening on a back side of the second array device, and forming one or more contact pads disposed in the opening. The first array device includes first front pads on a face side of the first array device, first back pads on a back side of the first array device, and interconnect contacts connected to part of the first front pads. The second array device includes second front pads on a face side of the second array device and bonded with the first back pads. The one or more contact pads are arranged over and connected to one or more of the interconnect contacts and at a level proximate to the second front pads with respect to the first array device.

In another aspect of the present disclosure, a 3D memory device includes a stacked device having a first array device and a second array device, an opening on a back side of the second array device, and one or more contact pads at a bottom of the opening. The first array device includes first front pads on a face side of the first array device, first back pads on a back side of the first array device, and interconnect contacts connected to part of the first front pads. The second array device includes second front pads on a face side of the second array device and bonded with the first back pads. The one or more contact pads are disposed over and connected to one or more of the interconnect contacts and at a level proximate to the second front pads with respect to the first array device.

In another aspect of the present disclosure, a 3D memory device includes a stacked device having a first array device and a second array device and one or more contact pads. The first array device includes first front pads on a face side of the first array device, first back pads on a back side of the first array device, and interconnect contacts connected to part of the first front pads. The second array device includes second front pads on a face side of the second array device and bonded with the first back pads. The one or more contact pads are configured at a level proximate to the second front pads with respect to the first array device, and disposed over and connected to one or more of the interconnect contacts.

Other aspects of the present disclosure can be understood by those skilled in the art in light of the description, the claims, and the drawings of the present disclosure.

DETAILED DESCRIPTION

The following describes the technical solutions according to various aspects of the present disclosure with reference to the accompanying drawings. Wherever possible, the same reference numbers will be used throughout the drawings to refer to the same or like parts. Apparently, the described aspects are merely some but not all of the aspects of the present disclosure. Features in various aspects may be exchanged and/or combined.

FIGS. 1-11 schematically show fabrication processes of an exemplary 3D array device 100 according to aspects of the present disclosure. The 3D array device 100 is a part of a memory device and may also be referred to as a 3D memory structure. Among the figures, top views are in an X-Y plane and cross-sectional views are in a Y-Z plane.

Figure 1:
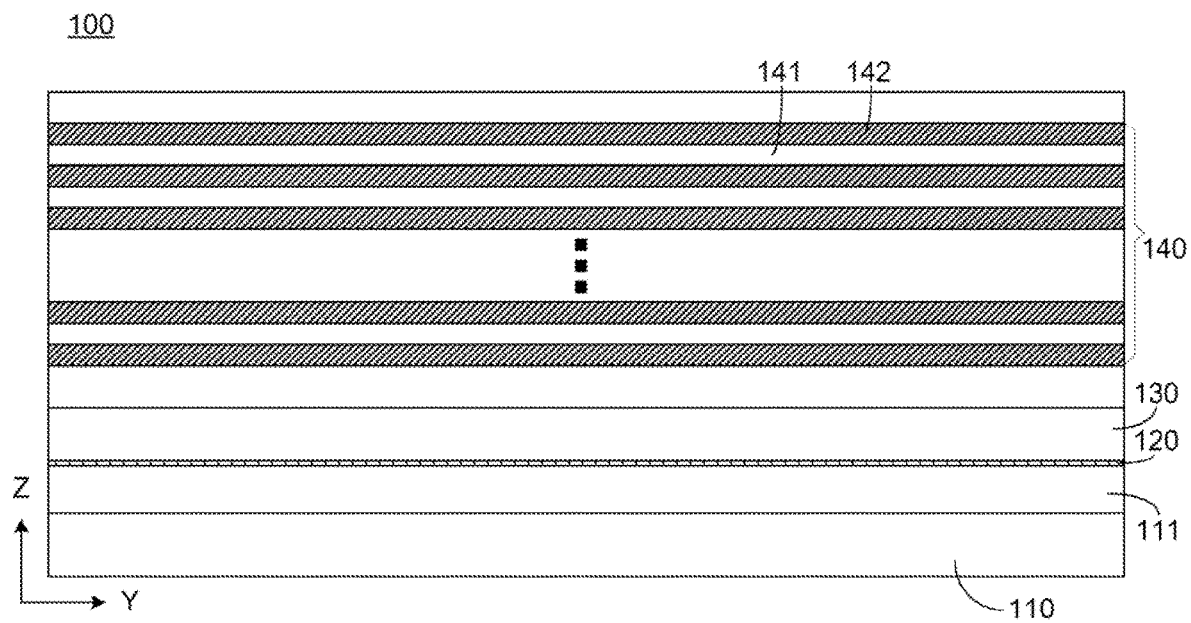
FIGS. 1 and 2 illustrate cross-sectional views of an exemplary three-dimensional (3D) array device at certain stages during a fabrication process according to various aspects of the present disclosure.

As shown in a cross-sectional view in FIG. 1, the 3D array device 100 includes a substrate 110. In some aspects, the substrate 110 may include a single crystalline silicon layer. The substrate 110 may also include a semiconductor material, such as germanium (Ge), silicon-germanium (SiGe), silicon carbide (SiC), silicon-on-insulator (SOI), germanium-on-insulator (GOI), polysilicon, or a Group III-V compound such as gallium arsenide (GaAs) or indium phosphide (InP). Optionally, the substrate 110 may also include an electrically non-conductive material such as glass, a plastic material, or a ceramic material. When the substrate 110 includes glass, plastic, or ceramic material, the substrate 110 may further include a thin layer of polysilicon deposited on the glass, plastic, or ceramic material. In this case, the substrate 110 may be processed like a polysilicon substrate. As an example, the substrate 110 includes an undoped or lightly doped single crystalline silicon layer in descriptions below.

In some aspects, a top portion of the substrate 110 is doped by n-type dopants via ion implantation and/or diffusion to form a doped region 111. The dopants of the doped region 111 may include, for example, phosphorus (P), arsenic (As), and/or antimony (Sb). As shown in FIG. 1, a cover layer 120 is deposited over the doped region 111. The cover layer 120 is a sacrificial layer and may include a single layer or a multilayer. For example, the cover layer 120 may include one or more of silicon oxide layer and silicon nitride layer. The cover layer 120 may be deposited by chemical vapor deposition (CVD), physical vapor deposition (PVD), atomic layer deposition (ALD), or a combination thereof. In some other aspects, the cover layer 120 may include another material such as aluminum oxide.

Further, over the cover layer 120, a sacrificial layer 130 is deposited. The sacrificial layer 130 may include a dielectric material, a semiconductor material, or a conductive material. The word "conductive", as used herein, indicates electrically conductive. An exemplary material for the sacrificial layer 130 is polysilicon.

After the polysilicon sacrificial layer 130 is formed, a layer stack 140 is formed. The layer stack 140 includes multiple pairs of stack layers, for example, including first dielectric layers 141 and second dielectric layers 142, stacked alternately over each other. The layer stack may include 64 pairs, 128 pairs, or more than 128 pairs of the first and second dielectric layers 141 and 142.

In some aspects, the first dielectric layers 141 and the second dielectric layers 142 are made of different materials. In descriptions below, the first dielectric layer 141 includes a silicon oxide layer exemplarily, which may be used as an isolation stack layer, while the second dielectric layer 142 includes a silicon nitride layer exemplarily, which may be used as a sacrificial stack layer. The sacrificial stack layer will be subsequently etched out and replaced by a conductor layer. The first dielectric layers 141 and the second dielectric layers 142 may be deposited via CVD, PVD, ALD, or a combination thereof.

Figure 2:
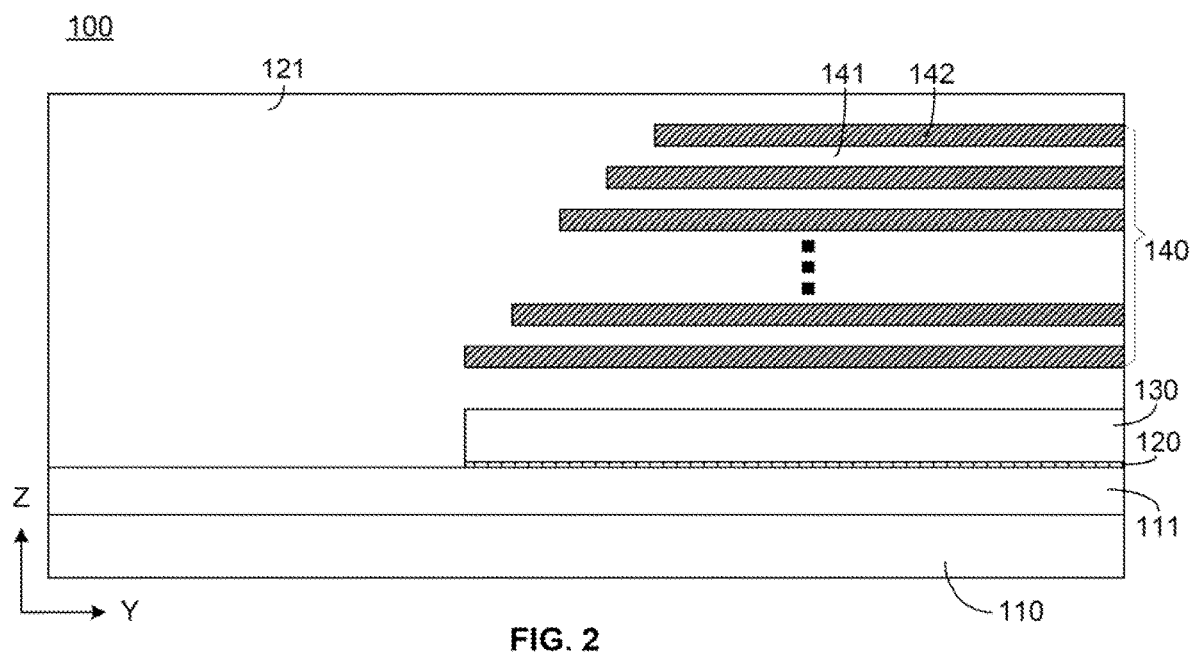

FIG. 2 shows a schematic cross-sectional view of the 3D array device 100 according to aspects of the present disclosure. As shown in FIG. 2, after the layer stack 140 is formed, a staircase formation process is performed to trim a part of the layer stack 140 into a staircase structure. Any suitable etching processes, including dry etch and/or wet etch process, may be used in the staircase formation process. For example, the height of the staircase structure may increase in a stepwise manner along the Y direction. A dielectric layer 121 is deposited to cover the staircase structure, the doped region 111, and the substrate 110. As shown in FIG. 2, the layer stack 140, the sacrificial layer 130, and the cover layer 120 are removed in a region on a side of the staircase structure, e.g., on the left side of the staircase structure. The region may be viewed as a contact region where interconnect contacts connected to contact pads may be configured or an opening for contact pads may be arranged. The word "connected" as used herein, indicates electrically connected. The contact region contains a portion of the dielectric layer 121 and thus is a dielectric region. In some aspects, the cover layer 120 is not etched away in the staircase formation process and a portion of the cover layer 120 may be buried under the dielectric 121 in the contact region.

Figure 3:
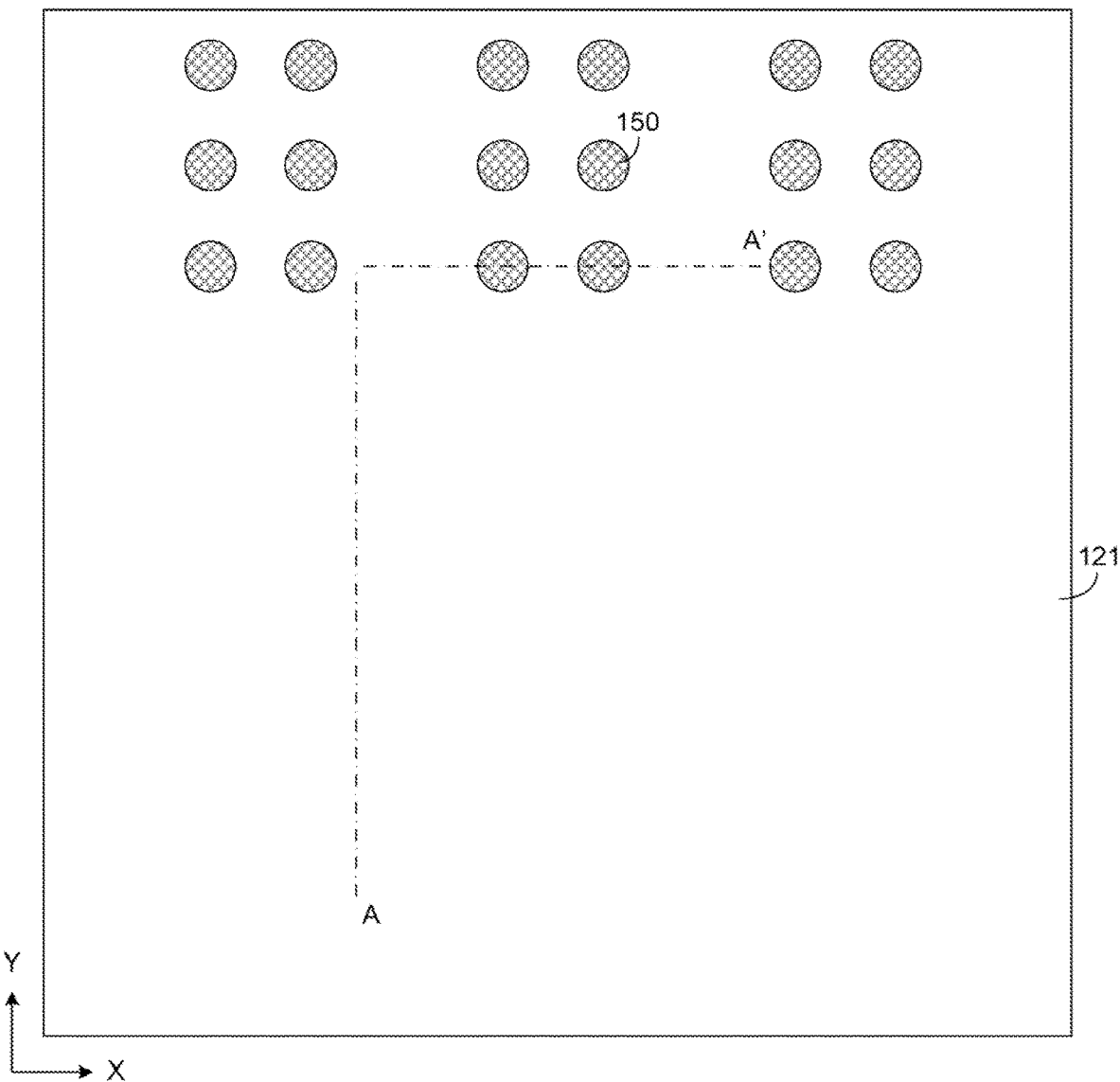
FIGS. 3 and 4 illustrate a top view and a cross-sectional view of the 3D array device shown in FIG. 2 after channel holes are formed according to various aspects of the present disclosure.
Figure 4:
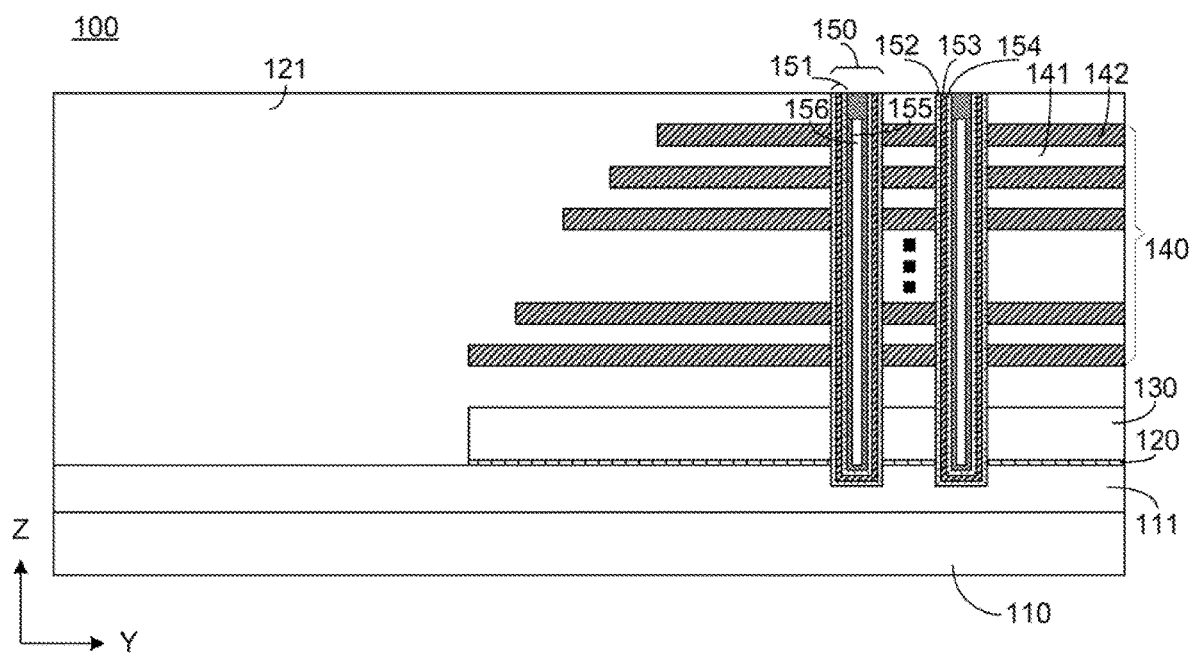

FIGS. 3 and 4 show a schematic top view and a schematic cross-sectional view of the 3D array device 100 after channel holes 150 are formed and then filled with layer structures according to aspects of the present disclosure. The cross-sectional view shown in FIG. 4 is taken along a line AA' of FIG. 3. The quantity, dimension, and arrangement of the channel holes 150 shown in FIGS. 3 and 4 and in other figures in the present disclosure are exemplary and for description purposes, although any suitable quantity, dimension, and arrangement may be used for the disclosed 3D array device 100 according to various aspects of the present disclosure.

As shown in FIGS. 3 and 4, the channel holes 150 are arranged to extend in the Z direction or in a direction approximately perpendicular to the substrate 110 and form an array of a predetermined pattern (not shown) in the X-Y plane. The channel holes 150 may be formed by, for example, a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer 130, the cover layer 120, and partially penetrates the doped region 111. After the channel holes 150 are formed, a functional layer 151 is deposited on the sidewall and bottom of the channel hole. The functional layer 151 includes a blocking layer 152 on the sidewall and bottom of the channel hole to block an outflow of charges, a charge trap layer 153 on a surface of the blocking layer 152 to store charges during an operation of the 3D array device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, or another wide bandgap material. The charge trap layer 153 may include one or more layers that may include one or more materials. The materials for the charge trap layer 153 may include polysilicon, silicon nitride, silicon oxynitride, nanocrystalline silicon, or another wide bandgap material. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, or another wide bandgap material.

In some aspects, the functional layer 151 includes an oxide-nitride-oxide (ONO) structure. Optionally, the functional layer 151 may have a structure different from the ONO configuration. When the ONO structure is used exemplarily in descriptions below, the blocking layer 152 is a silicon oxide layer, the charge trap layer 153 is a silicon nitride layer, and the tunnel insulation layer 154 is another silicon oxide layer.

Further, a channel layer 155 is deposited on the tunnel insulation layer 154. The channel layer 155 is also referred to as a "semiconductor channel" and includes polysilicon in some aspects. Alternatively, the channel layer 155 may include amorphous silicon. Like the channel holes, the channel layer 155 also extends through the layer stack 140 and into the doped region 111. The blocking layer 152, the charge trap layer 153, the tunnel insulation layer 154, and the channel layer 155 may be deposited by, e.g., CVD, PVD, ALD, or a combination of two or more of these processes. The channel hole 150 is filled by an oxide material 156 after the channel layer 155 is formed. The structure formed in a channel hole 150, including the functional layer 151 and channel layer 155, may be considered as a channel structure.

In the process described above, the channel holes 150 are etched after the staircase structure is formed. The channel holes 150 may also be formed before the staircase formation process. For example, after the layer stack 140 is fabricated as shown in FIG. 1, the channel holes 150 may be formed and then the functional layer 151 and the channel layer 155 may be deposited. After the channel holes 150 are filled with the oxide material 156, the staircase formation process may be performed to form the staircase structure.

Figure 5:
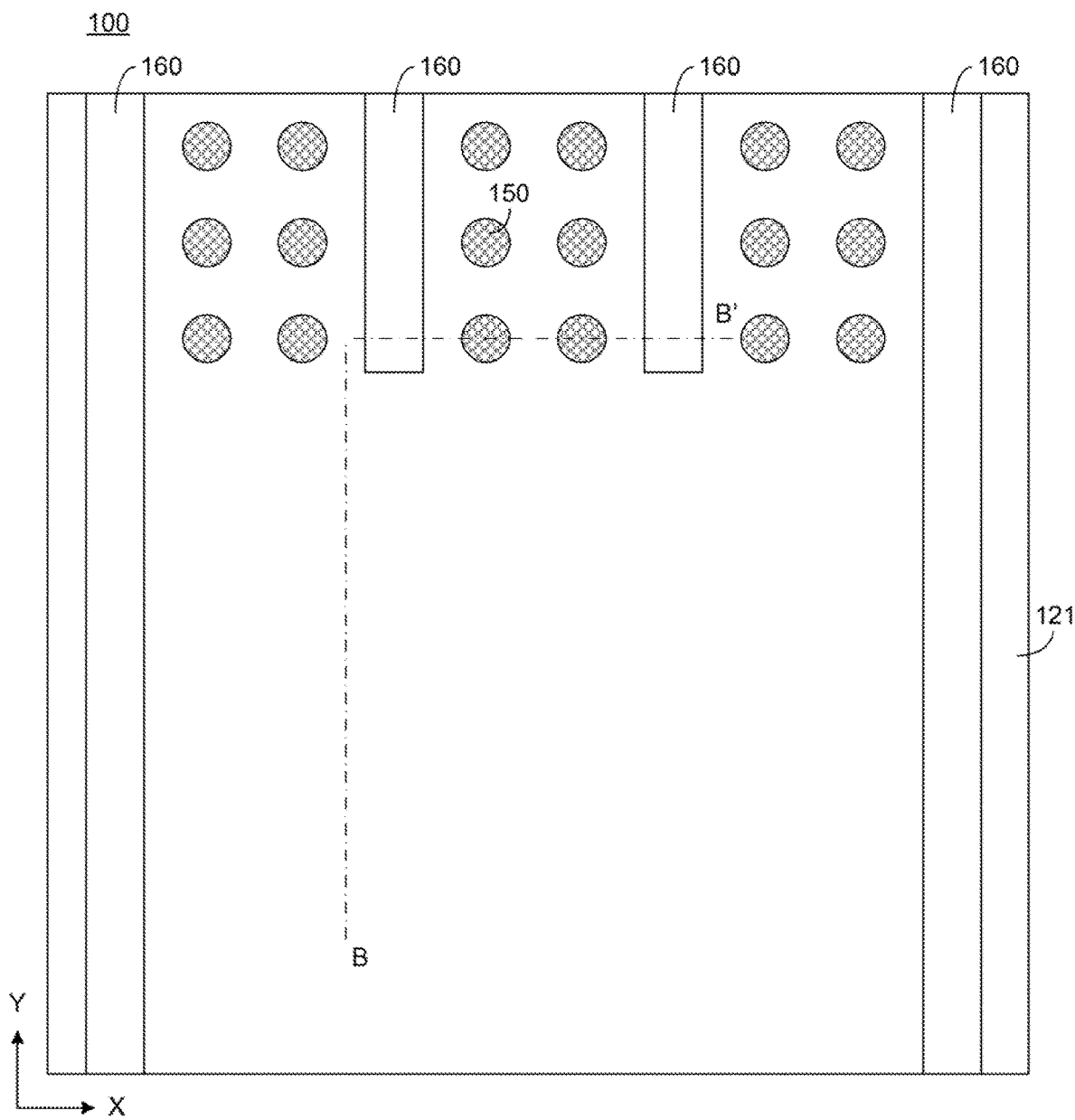
FIGS. 5 and 6 illustrate a top view and a cross-sectional view of the 3D array device shown in FIGS. 3 and 4 after gate line slits are formed according to various aspects of the present disclosure.
Figure 6:
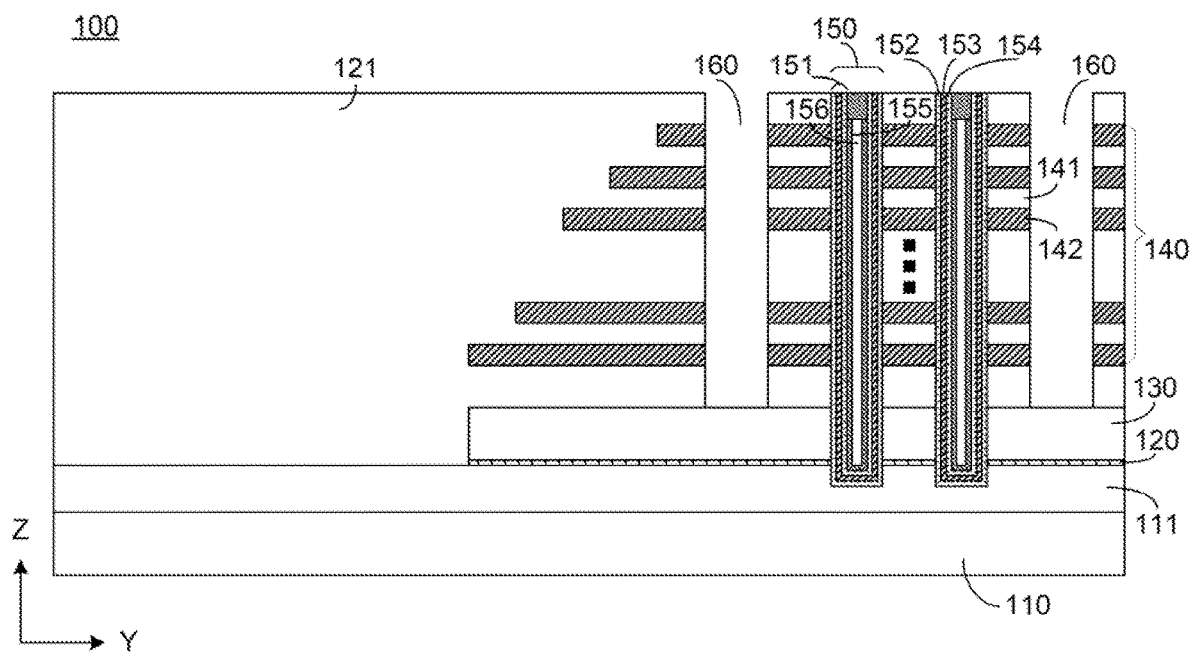

FIGS. 5 and 6 show a schematic top view and a schematic cross-sectional view of the 3D array device 100 after gate line slits 160 are formed according to aspects of the present disclosure. The cross-sectional view shown in FIG. 6 is taken along a line BB' of FIG. 5. A gate line slit may also be referred to as a gate line slit structure. The 3D array device 100 has a great number of channel holes 150 arranged in memory planes (not shown). Each memory plane is divided into memory blocks (not shown) and memory fingers by the gate line slits. For example, the configuration of the channel holes 150 as shown in FIG. 5 reflects memory fingers among the gate line slits 160.

The gate line slits 160 may be formed by, e.g., a dry etch process or a combination of dry and wet etch processes. As shown in FIGS. 5 and 6, the gate line slits 160 extend, e.g., in the X direction horizontally, and extend through the layer stack 140 and reach or partially penetrate the sacrificial layer 130 in the Z direction or in a direction approximately perpendicular to the substrate 110. As such, at the bottom of the gate line slit 160, the sacrificial layer 130 is exposed. Then, spacer layers (not shown) are deposited on the sidewall and bottom of the gate line slit 160 by CVD, PVD, ALD, or a combination thereof. The spacer layers are configured to protect the first and second dielectric layers 141 and 142 and may include, for example, silicon oxide and silicon nitride.

After the spacer layers are deposited, selective etching is performed such that parts of the spacer layers at the bottom of the gate line slits 160 are removed by dry etch or a combination of dry etch and wet etch. The sacrificial layer 130 is exposed again. Subsequently, a selective etch process, e.g., a selective wet etch process, is performed to remove the sacrificial layer 130. Removal of the sacrificial layer 130 creates a cavity and exposes the cover layer 120 and bottom portions of the blocking layers 152 formed in the channel holes 150. Further, multiple selective etch processes, e.g., multiple selective wet etch processes, are performed to remove the exposed portions of the blocking layer 152, the charge trap layer 153, and the tunnel insulation layer 154 consecutively, which exposes bottom side portions of the channel layer 155.

When the cover layer 120 is silicon oxide and/or silicon nitride, the cover layer 120 may be removed when the bottom portions of the functional layers 151 are etched away. In certain aspects, the cover layer 120 includes a material other than silicon oxide or silicon nitride, and the cover layer 120 may be removed by one or more additional selective etch processes. Removal of the cover layer 120 exposes the top surface of the doped region 111.

After the etch processes, the doped region 111 and side portions of the channel layers 155 close to the bottom of the channel hole 150 are exposed in the cavity left by etching away the sacrificial layer 130 and the cover layer 120. The cavity is filled by a semiconductor material, e.g., polysilicon, to form a semiconductor layer 131, e.g., by a CVD and/or PVD deposition process. The semiconductor layer 131 is n-doped, formed on the exposed surface of the doped region 111 and on sidewalls or side portions of the channel layers 155, and connected to the doped region 111 and the channel layers 155.

Optionally, a selective epitaxial growth is performed such that a layer of single crystalline silicon may be grown on the exposed surface of the doped region 111 and a polysilicon layer may be grown on the exposed surface of the channel layer 155. Thus, the semiconductor layer 131 may include adjoined layers of single crystalline silicon and polysilicon.

Figure 7:
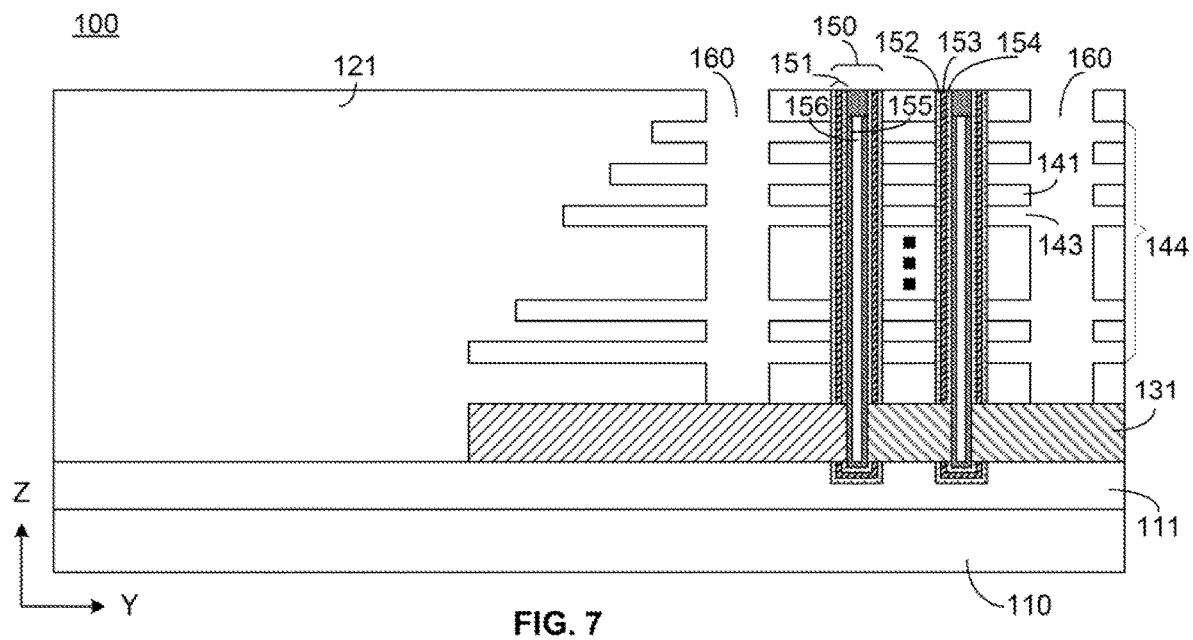
FIGS. 7, 8, and 9 illustrate cross-sectional views of the 3D array device shown in FIGS. 5 and 6 at certain stages in the fabrication process according to various aspects of the present disclosure.

When the bottom parts of the functional layer 151 and the cover layer 120 are etched, some spacer layers are etched away and the rest spacer layers remain on the sidewall of the gate line slits 160 to protect the first and second dielectric layers 141 and 142. After the semiconductor layer 131 is formed, the remaining spacer layers are removed in a selective etch process, e.g., a selective wet etch process, which exposes the sides of the second dielectric layer 142 around the gate line slits 160. In some aspects, the innermost spacer layer, which is in contact with the sidewall, is silicon nitride. Because the second dielectric layers 142 are also silicon nitride layers, the innermost spacer layer and the second dielectric layers 142 may be removed together during the etch process, leaving cavities 143 between the first dielectric layers 141, as shown in FIG. 7. As such, the layer stack 140 is changed into a layer stack 144.

Figure 8:
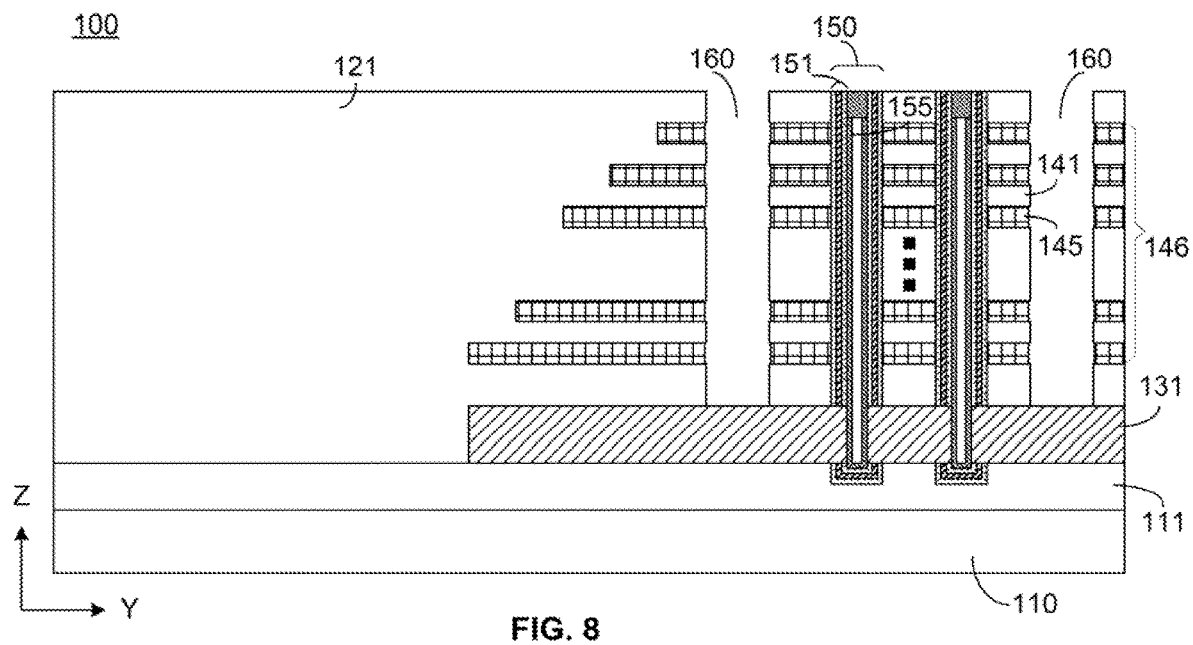

Further, a conductive material such as tungsten (W) is grown to fill the cavities 143 left by the removal of the second dielectric layers 142, forming conductor layers 145 between the first dielectric layers 141. After the conductor layers 145 are fabricated, the layer stack 144 is converted to a layer tack 146, as shown in FIG. 8. The layer stack 146 includes the first dielectric layers 141 and the conductor layers 145 that are alternatingly stacked over each other. In some aspects, before metal W is deposited in the cavities 143, a dielectric layer (not shown) of a high-k dielectric material such as aluminum oxide may be deposited, followed by deposition of a layer of a conductive material such as titanium nitride (TiN) (not shown). Further, metal W is deposited to form the conductor layers 145. CVD, PVD, ALD, or a combination of two or more of these processes may be used in the deposition processes. Alternatively, another conductive material, such as cobalt (Co), copper (Cu), aluminum (Al), titanium (Ti), tantalum (Ta), tantalum nitride (TaN), doped silicon, or any combination thereof, may be used to form the conductor layers 145.

Referring to FIG. 8, a portion of each functional layer 151 in a channel hole 150 is between a portion of one of the conductor layers 145 and a portion of a channel layer 155 in the channel hole 150. Each conductor layer 145 is configured to connect rows of NAND memory cells in an X-Y plane and is configured as a word line for the 3D array device 100. The channel layer 155 formed in the channel hole 150 is configured to connect a column or a string of NAND memory cells along the Z direction and configured as a bit line for the 3D array device 100. As such, a portion of the functional layer 151 in the channel hole 150 in the X-Y plane, as a part of a NAND memory cell, is arranged between a conductor layer 145 and a channel layer 155, i.e., between a word line and a bit line. The functional layer 151 may also be considered as disposed between the channel layer 155 and the layer stack 146. A portion of the conductor layer 145 that is around a portion of the channel hole 150 functions as a control gate or gate electrode for a NAND memory cell. The 3D array device 100 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

Figure 9:
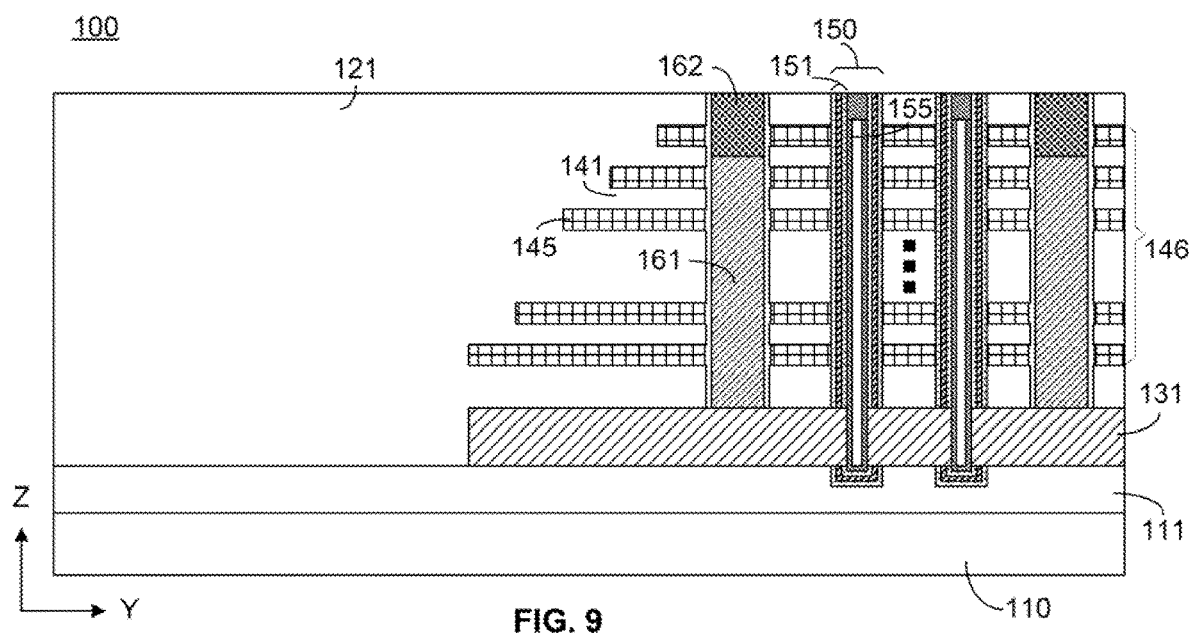

After the conductor layers 145 are grown in the cavities 143, a dielectric layer (e.g., a silicon oxide layer) may be deposited on the sidewalls and bottom surfaces of the gate line slits 160 by CVD, PVD, ALD, or a combination thereof. A dry etch process or a combination of dry etch and wet etch processes may be performed to remove the dielectric layer at the bottom of the gate line slits to expose parts of the semiconductor layer 131. The gate line slits are filled with a conductive material 161 (e.g., doped polysilicon) and a conductive plug 162 (e.g., metal W). The conductive material 161 in the gate line slit extends through the layer stack 146 and contacts the semiconductor layer 131, as shown in FIG. 9. The word "contact" as a verb indicates electrically contacting an object as used herein. The filled gate line slits become an array common source for the 3D array device 100 in some aspects. Optionally, forming the array common source in the gate line slits includes depositing an insulation layer, a conductive layer (such as TiN, W, Co, Cu, or Al), and then a conductive material such as doped polysilicon.

Figure 10:
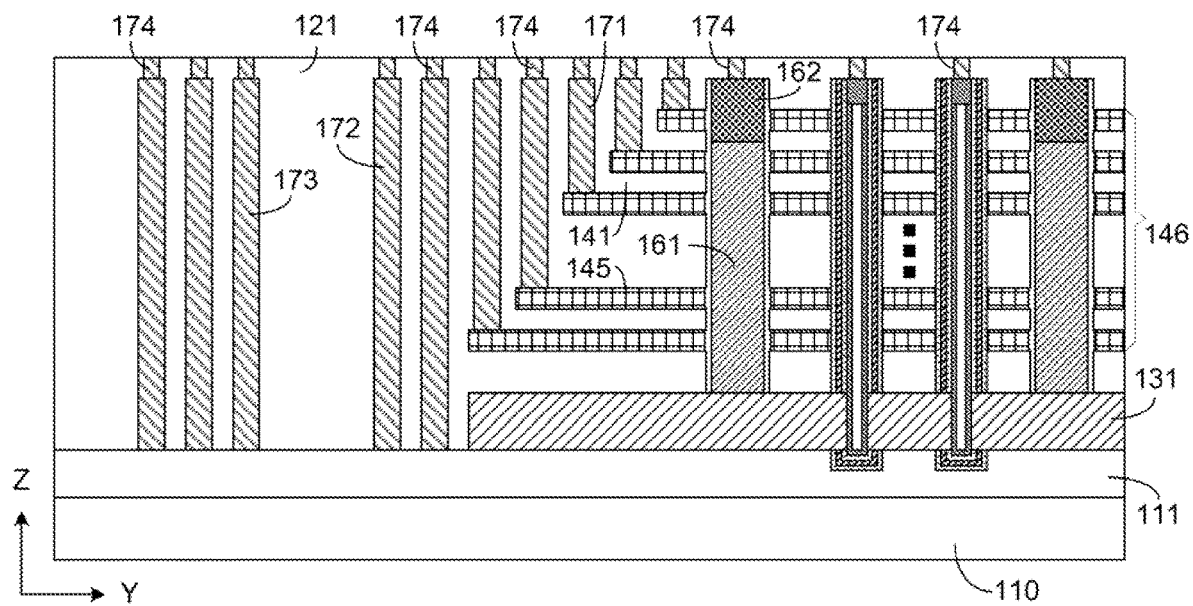
FIGS. 10 and 11 illustrate cross-sectional views of the 3D array device shown in FIG. 9 at certain stages in the fabrication process according to various aspects of the present disclosure.
Figure 11:
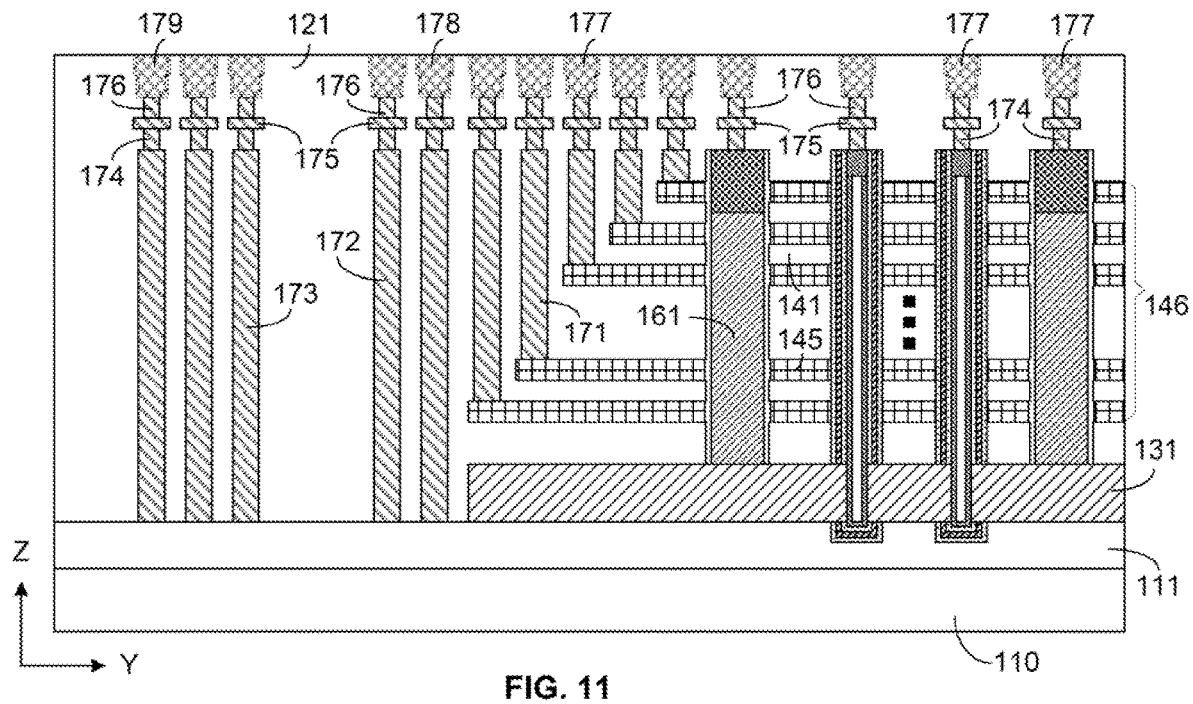

FIGS. 10 and 11 show schematic cross-sectional views of the 3D array device 100 at certain stages after contacts, vias, conductor layers, and connecting pads are formed according to aspects of the present disclosure. After the gate line slits 160 are filled and the array common source is formed as shown in FIG. 9, openings for word line contacts 171 and interconnect contacts 172 and 173 may be formed respectively by, e.g., a dry etch process or a combination of dry and wet etch processes. The contacts 171-173 are arranged as interconnects for the 3D array device 100. The openings for the contacts 171-173 are respectively filled with a conductive material by CVD, PVD, ALD, electroplating, electroless plating, or any combination thereof. As shown in FIG. 10, the interconnect contacts 173 are formed in the contact region (i.e., a dielectric region) and beside the layer stack 146 and the NAND memory cells. The staircase structure is disposed between the interconnect contacts 172-173 and the stack layer 146, i.e., between the interconnect contacts 172-173 and the NAND memory cells. In some aspects, the interconnect contacts 172-173 extend to reach the doped region 111. Alternatively, the interconnect contacts 172-173 may extend to a level above the doped region 111 in the dielectric layer 121. The conductive material for the contacts 171-173 may include W, Co, Cu, Al, or a combination thereof. Optionally, a layer of a conductive material (e.g., TiN) may be deposited as a contact layer before another conductive material is deposited when the contacts 171-173 are fabricated respectively.

Further, a CVD or PVD process is performed to deposit a dielectric material (e.g., silicon oxide or silicon nitride) on the 3D array device 100, and the dielectric layer 121 becomes thicker. Openings for vias 174 are formed by a dry etch process or a combination of dry and wet etch processes. The openings may be subsequently filled with a conductive material such as W, Co, Cu, Al, or a combination thereof to form the vias 174, as shown in FIG. 10. CVD, PVD, ALD, electroplating, electroless plating, or a combination thereof may be performed. The vias 174 are connected to the contacts 171-173, the upper ends of corresponding NAND strings, and the plugs 162 of the array common source. Optionally, a layer of a conductive material (e.g., TiN) may be deposited first before filling the openings to form the vias 174.

Further, conductor layers 175 for interconnect may be grown by CVD, PVD, ALD, electroplating, electroless plating, or a combination thereof. The conductor layers 175 are deposited over and contact the vias 174, respectively, and include a conductive material such as W, Co, Cu, Al, or a combination thereof.

Similar to the formation of the vias 174, vias 176 are made over the conductor layers 175. For example, a dielectric material may be deposited to cover the conductor layers 175 and make the dielectric layer 121 thicker, openings for vias 176 may be formed, and the openings may be subsequently filled with a conductive material to form the vias 176.

Further, a CVD or PVD process is performed to deposit a dielectric material (e.g., silicon oxide or silicon nitride) to cover the vias 176 and thicken the dielectric layer 121 further. Openings are made and then filled to form connecting contacts 177, 178, and 179 that serve as interconnects with a peripheral device. As shown in FIG. 11, the connecting pads 177-179 are deposited over and contact the vias 176, respectively. As such, the connecting pads 177 are connected to the word line contacts 171, the upper ends of corresponding NAND strings, and the plugs 162, respectively. The connecting pads 178 and 179 are connected to the interconnect contacts 172 and 173, respectively. The connecting pads 177-179 may include a conductive material such as W, Co, Cu, Al, or a combination thereof. Optionally, a contact layer of a conductive material (e.g., TiN) may be deposited first before filling the openings to form the connecting pads 177-179.

Figure 12:
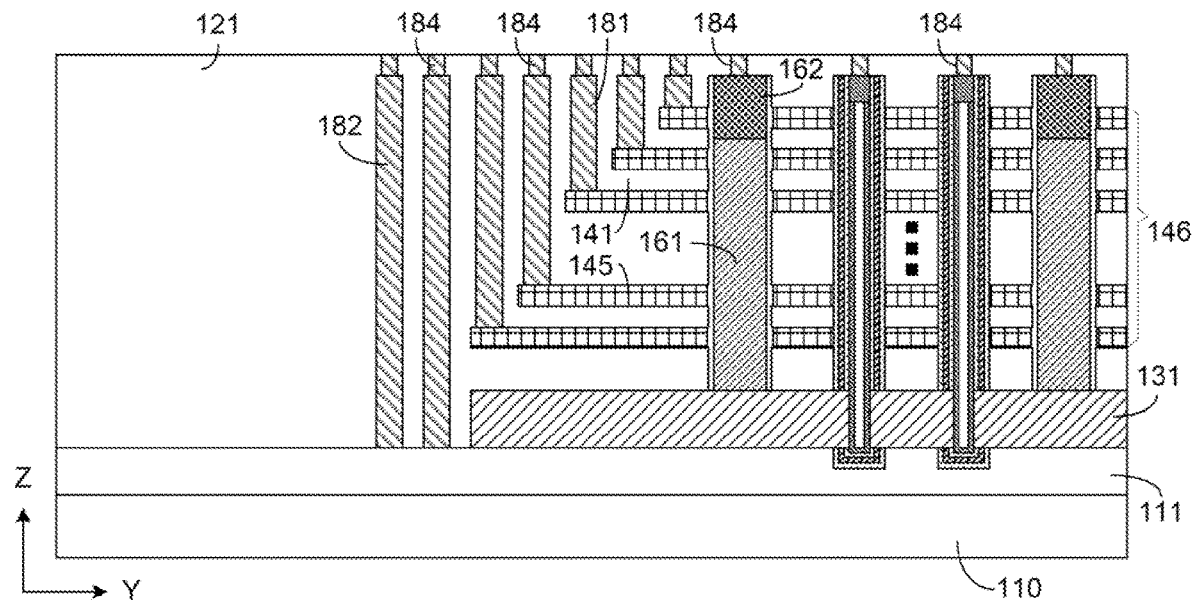
FIGS. 12 and 13 illustrate cross-sectional views of another exemplary 3D array device at certain stages of a fabrication process according to various aspects of the present disclosure.
Figure 13:
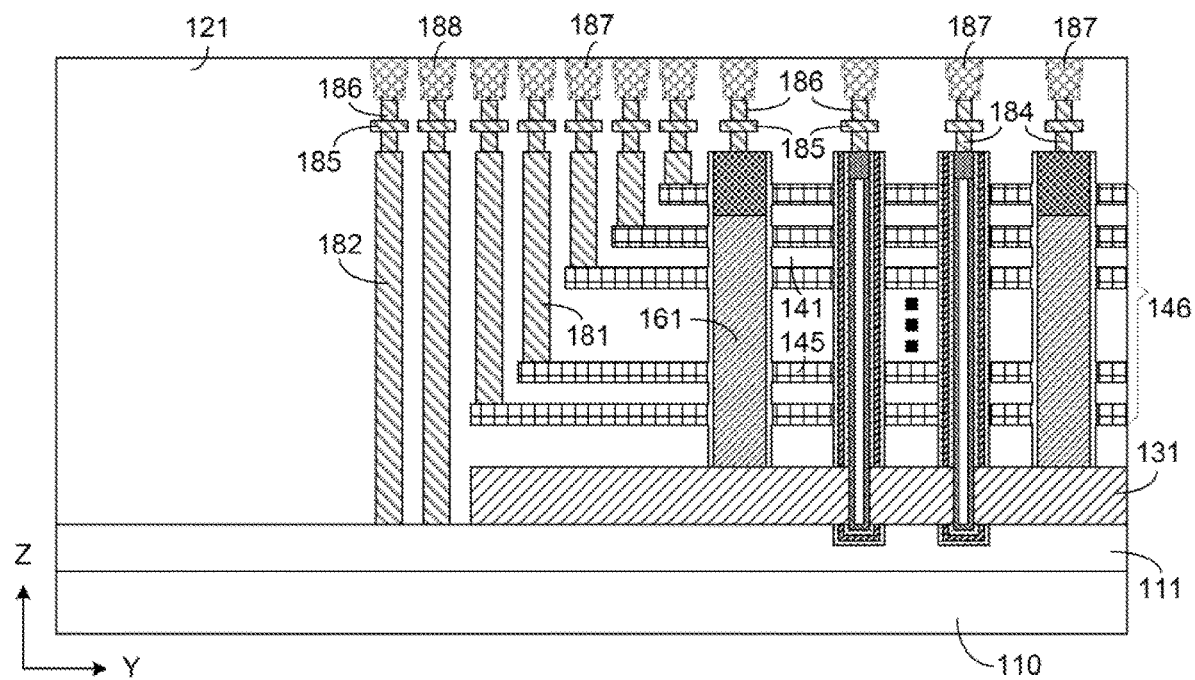

FIGS. 12 and 13 show schematic cross-sectional views of a 3D array device 180 at certain stages of a fabrication process according to aspects of the present disclosure. Referring to the 3D array device 100 as shown in FIG. 9, the gate line slits 160 are filled and the array common source is formed. After word line contacts 181, interconnect contacts 182, and vias 184 are formed, respectively, the array device 100 becomes the 3D array 180, as shown in FIG. 12. Some fabrication processes of the 3D array devices 100 and 180 may be the same or similar. Openings for the contacts 181 and 182 are formed respectively by, e.g., a dry etch process or a combination of dry and wet etch processes. The openings for the contacts 181 and 182 are then filled with a conductive material. As shown in FIG. 12, the interconnect contacts 182 are formed beside the staircase structure. A region on the left side of the interconnect contacts 182 may be considered as a contact region where an opening for contact pads will be arranged. The contact region is a dielectric region containing a portion of the dielectric layer 121 beside the layer stack 146 and the NAND memory cells. In some aspects, the interconnect contacts 182 extend to reach the doped region 111. Alternatively, the interconnect contacts 182 may extend to a level above the doped region 111 in the dielectric layer 121. The conductive material for the contacts 181-182 may include W, Co, Cu, Al, or a combination thereof.

Further, a dielectric material (e.g., silicon oxide or silicon nitride) is deposited on the 3D array device 180, and openings for vias 184 are formed and then filled with a conductive material such as W, Co, Cu, Al, or a combination thereof, as shown in FIG. 12. The vias 184 are connected to the contacts 181-182, the upper ends of corresponding NAND strings, and the plugs 162 of the array common source.

Further, similar to the formation of the conductor layer 175, vias 176, connecting pads 177-179, conductor layers 185, vias 186, and connecting pads 187 and 188 are made using the same or similar materials, respectively. The conductor layers 185 for interconnect are formed over and contact the vias 184, respectively. A dielectric material is deposited to cover the conductor layers 185, and openings for the vias 186 are formed over the conductor layers 185 and filled with a conductive material. The vias 186 contact the conductor layers 185, respectively. Further, a dielectric material is deposited to cover the vias 186 and thicken the dielectric layer 121. Openings are made and then filled to form the connecting contacts 187 and 188 that serve as interconnects with the 3D array device 100. As shown in FIG. 13, the connecting pads 187-188 are deposited over and contact the vias 186, respectively. Hence, the connecting pads 187 are connected to the word line contacts 181, the upper ends of corresponding NAND strings, and the plugs 162, respectively. The connecting pads 188 are connected to the interconnect contacts 182, respectively. The connecting pads 187-188 include a conductive material (e.g., W, Co, Cu, Al, or a combination thereof).

Figure 14:
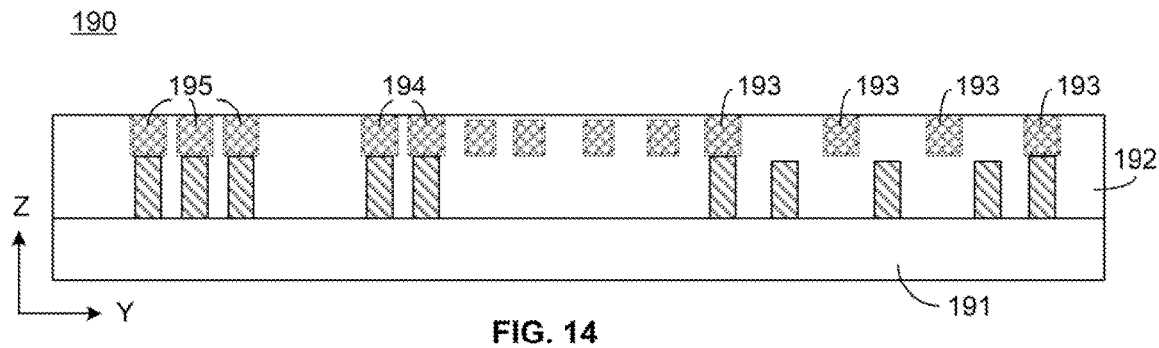
FIG. 14 illustrates a cross-sectional view of an exemplary peripheral device according to various aspects of the present disclosure.

FIG. 14 shows a schematic cross-sectional view of a peripheral device 190 according to aspects of the present disclosure. The peripheral device 190 is a part of a memory device and may also be referred to as a peripheral structure. The peripheral device 190 includes a substrate 191 that may include single crystalline silicon, Ge, SiGe, SiC, SOI, GOI, polysilicon, or a Group III-V compound such as GaAs or InP. Peripheral CMOS circuits (e.g., control circuits) (not shown) are fabricated on the substrate 191 and used for facilitating the operation of the array devices 100 and 180. For example, the peripheral CMOS circuits may include metal-oxide-semiconductor field-effect transistors (MOSFETs) and provide functional devices such as page buffers, sense amplifiers, column decoders, and row decoders. A dielectric layer 192 is deposited over the substrate 191 and the CMOS circuits. Connecting pads (such as connecting pads 193, 194, and 195) and vias are formed in the dielectric layer 192. The dielectric layer 192 may include one or more dielectric materials such as silicon oxide and silicon nitride. The connecting pads 193-195 are configured as interconnects with the 3D array device 100 and may include a conductive material such as W, Co, Cu, Al, or a combination thereof.

For the 3D array devices 100 and 180 and peripheral device 190, the bottom side of the substrate 110 or 191 may be referred to as the back side, and the side with the connecting pads 177-179, 187-188, or 193-195 may be referred to as the front side or face side. Further, the connecting pads 177-179, 187-188, and 193-195, formed on the face sides of the devices 100, 180, and 190, may be referred to as the front pads.

Figure 15:
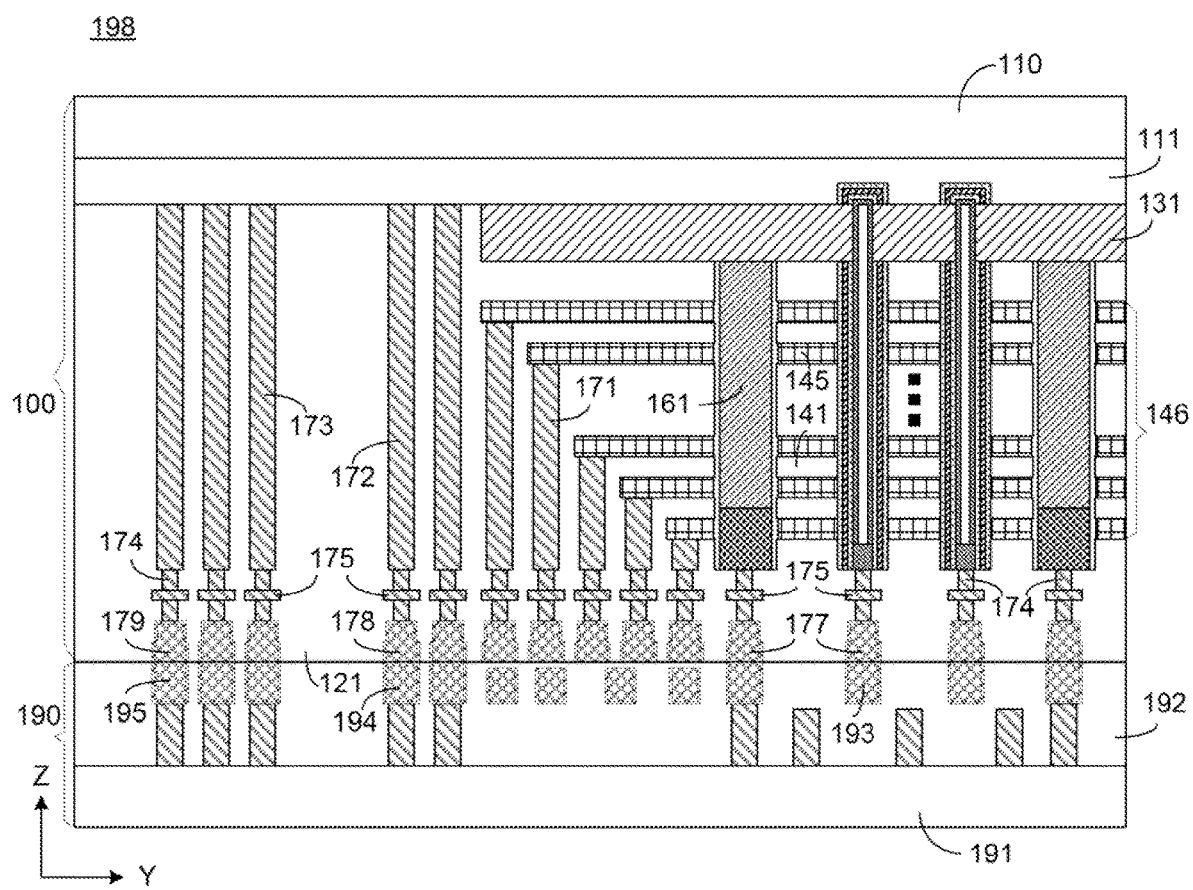
FIG. 15 illustrates a cross-sectional view of a 3D memory structure after the 3D array device shown in FIG. 11 is bonded with the peripheral device shown in FIG. 14 according to various aspects of the present disclosure.
Figure 16:
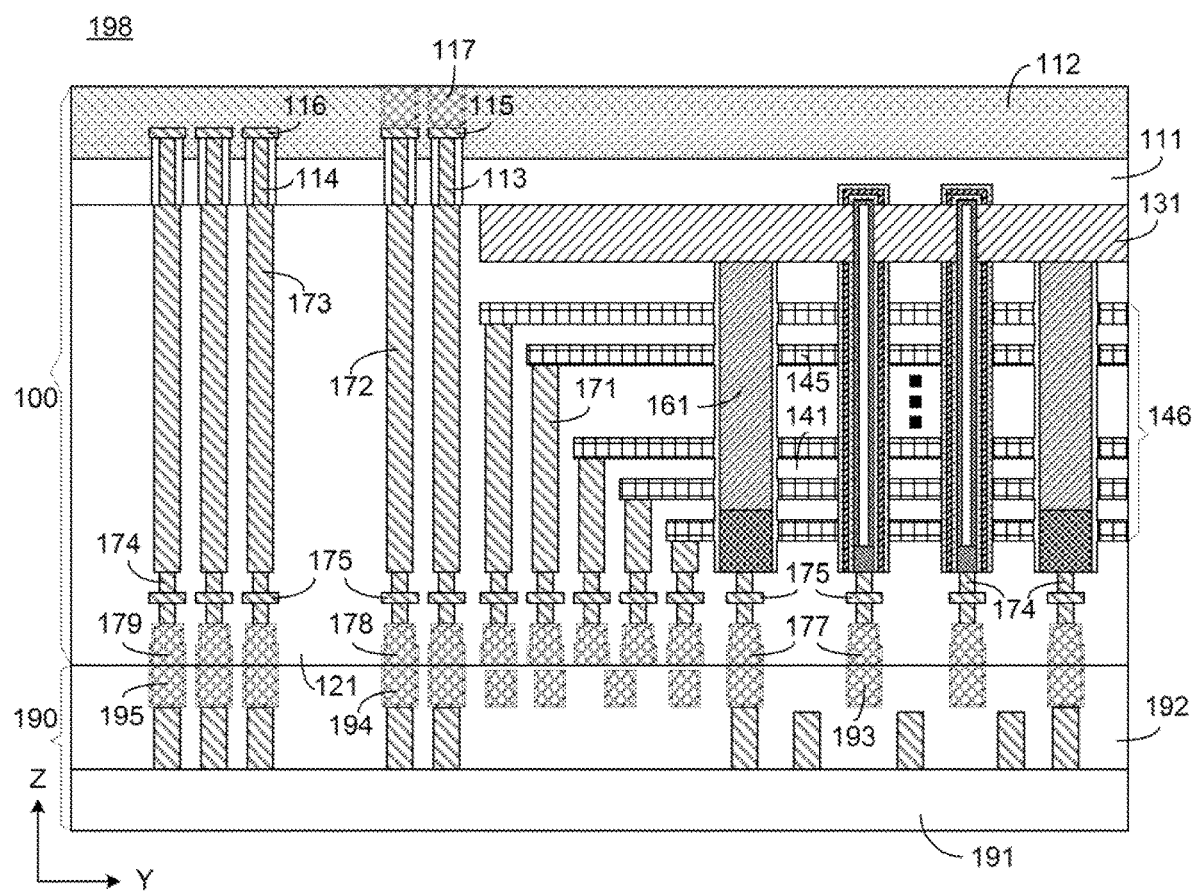
FIG. 16 illustrates a cross-sectional view of the 3D memory structure shown in FIG. 15 at a certain stage according to various aspects of the present disclosure.

FIGS. 15 and 16 schematically show fabrication processes of an exemplary 3D memory structure 198 according to aspects of the present disclosure. The cross-sectional views of FIGS. 15-16 are in a Y-Z plane. The 3D memory structure 198 includes the 3D array device 100 shown in FIG. 11 and the peripheral device 190 shown in FIG. 14.

The 3D array device 100 and peripheral device 190 are bonded by a flip-chip bonding method to form the 3D memory structure 198, as shown in FIG. 15. In some aspects, the 3D array device 100 is flipped vertically and becomes upside down with the top surfaces of the connecting pads 177-179 facing downward in the Z direction. The two devices are placed together such that the 3D array device 100 is above the peripheral device 190. After an alignment is made, e.g., the connecting pads 177-179 are aligned with the connecting pads 193-195, respectively, the 3D array device 100 and peripheral device 190 are joined face to face and bonded together. The layer stack 146 and the peripheral CMOS circuits become sandwiched between the substrates 110 and 191 or between the doped region 111 and the substrate 191. In some aspects, a solder or a conductive adhesive is used to bond the connecting pads 177-179 with the connecting pads 193-195, respectively. As such, the connecting pads 177-179 are connected to the connecting pads 193-195, respectively. The 3D array device 100 and peripheral device 190 are in electrical communication after the flip-chip bonding process is completed.

Thereafter, from the bottom surface (after the flip-chip bonding), the substrate 110 of the 3D array device 100 is thinned by a thinning process, such as wafer grinding, dry etch, wet etch, CMP, or a combination thereof. A dielectric layer 112 is grown over the doped region 111 by a deposition process (e.g., a CVD or PVD process). Openings over the interconnect contacts 172 and 173 are formed by a dry etch process or a combination of dry etch and wet etch processes. The opening penetrates through the dielectric layer 112 and the doped region 111, and expose the interconnect contacts 172 and 173 at the bottom of the openings. Further, a CVD or PVD process is performed to deposit a dielectric layer (e.g., a silicon oxide or silicon nitride layer) on the sidewall and bottom of the openings. The dielectric layer at the bottom of the openings is etched out. The openings is filled to form vias 113 and 114, which are connected to the interconnect contacts 172 and 173 respectively.

After the vias 113 and 114 are made, conductor layers 115 and 116 are deposited through CVD, PVD, ALD, electroplating, electroless plating, or a combination thereof. The conductor layers 115 and 116 are arranged over and contact the vias 113 and 114, respectively, and include a conductive material such as W, Co, Cu, Al, or a combination thereof. The conductor layers 115 and 116 may also be referred to as conductor elements. Further, a CVD or PVD process is performed to thicken the dielectric layer 112 and cover the conductor layers 115 and 116 with a dielectric material. Similar to the formation of the connecting pads 177-179, openings are formed and then filled with a conductive material to form connecting pads 117. The connecting pads 117, formed over and connected to the conductor layers 115, are configured for connection between the 3D array devices 100 and 180. The connecting pads 117, formed on the back side of the 3D array device 100, may be referred to as the back pads.

Figure 17:
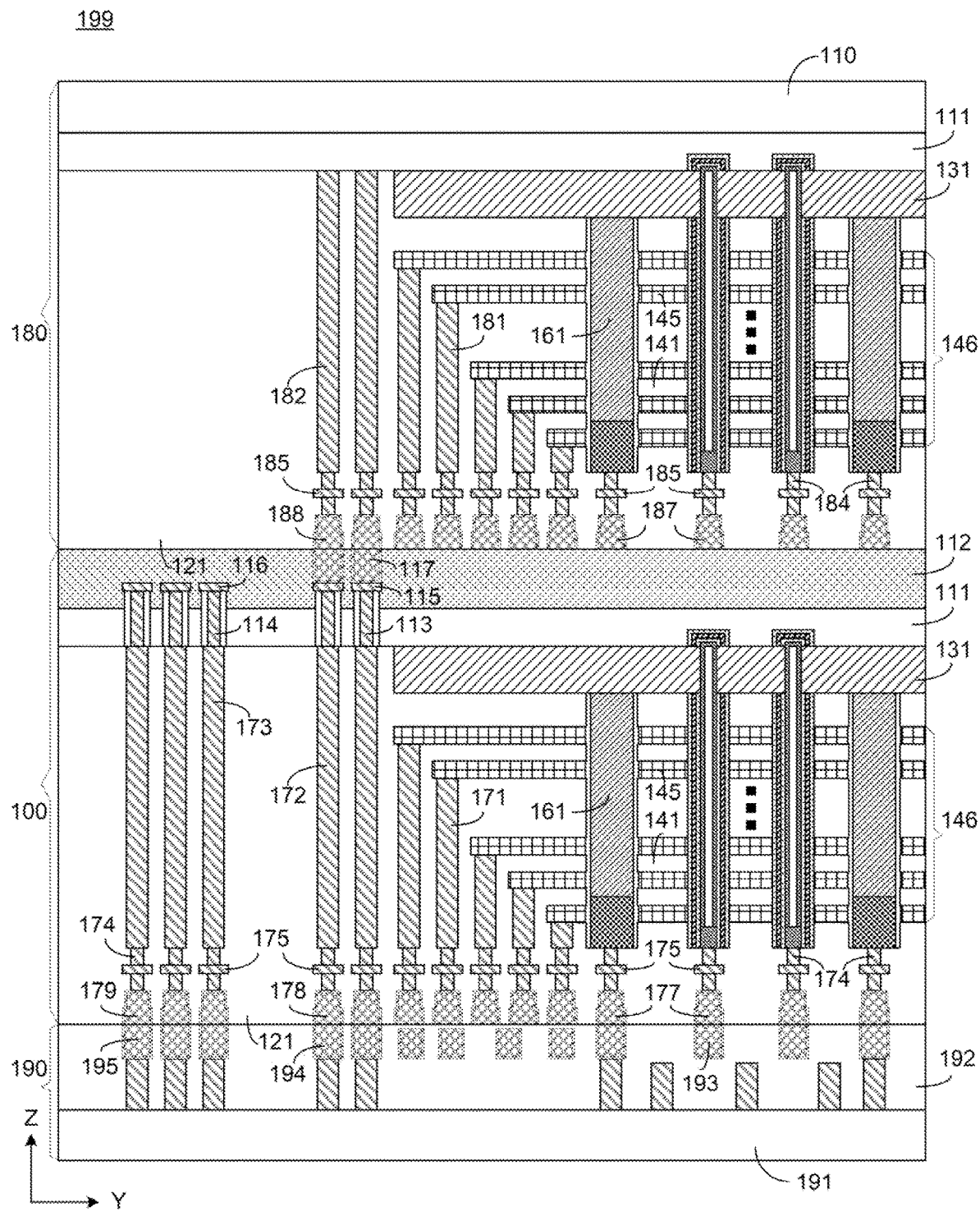
FIG. 17 illustrates a cross-sectional view of an exemplary 3D memory device after the 3D memory structure shown in FIG. 16 is bonded with the 3D array device shown in FIG. 13 according to various aspects of the present disclosure.
Figure 18:
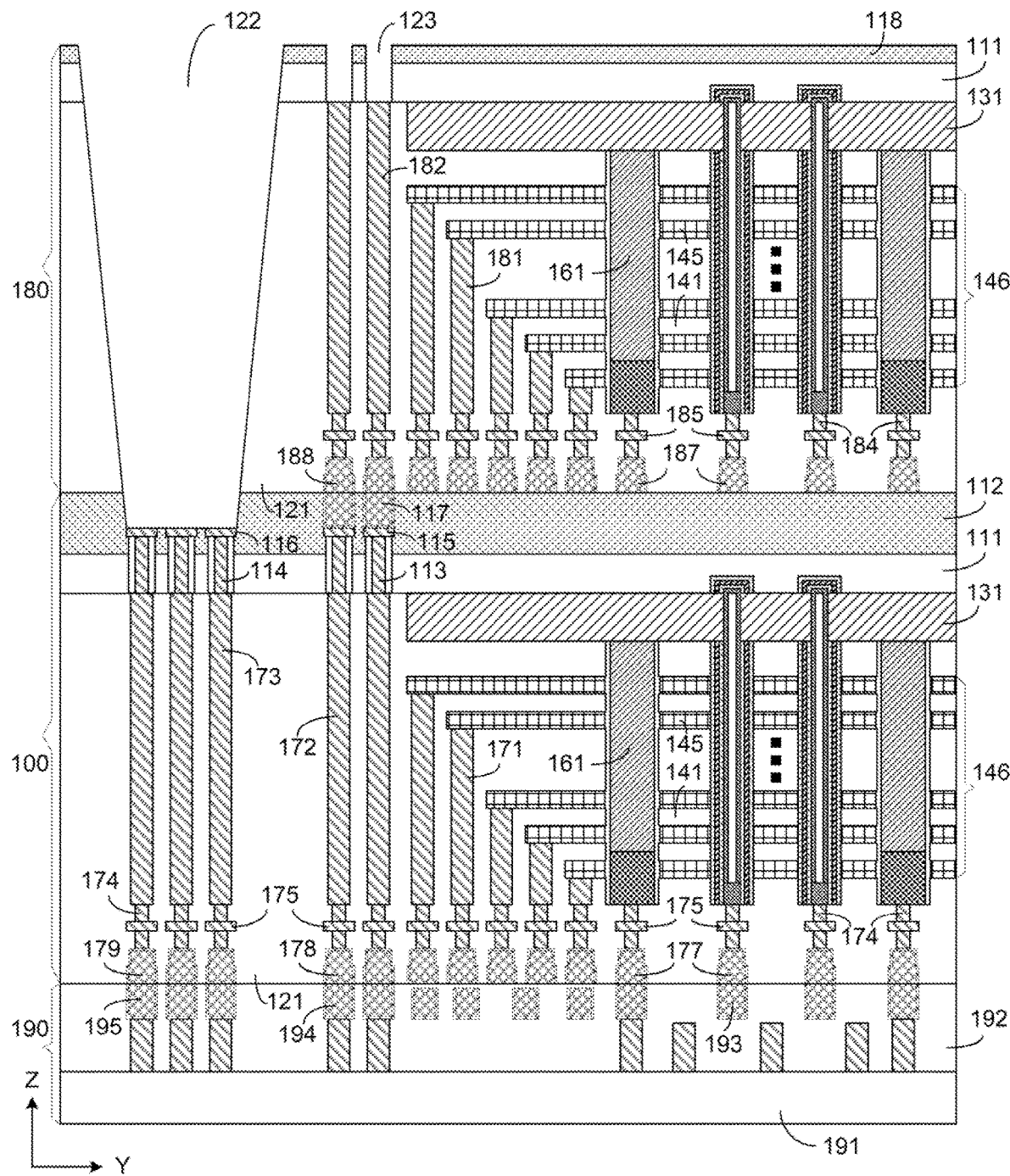
FIGS. 18 and 19 illustrate cross-sectional views of the 3D memory device shown in FIG. 17 at certain stages according to various aspects of the present disclosure.
Figure 19:
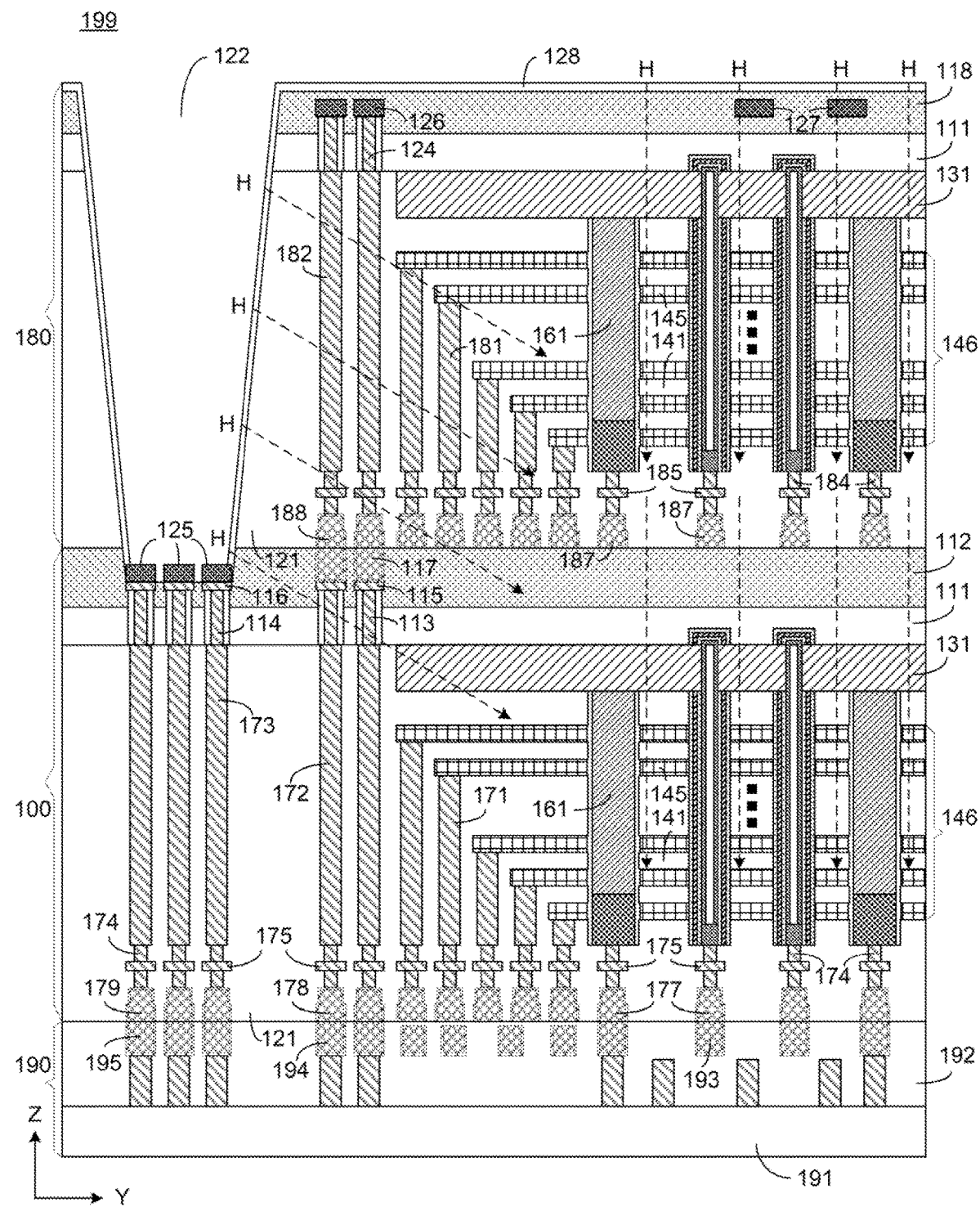

FIGS. 17, 18, and 19 schematically show fabrication processes of an exemplary 3D memory device 199 according to aspects of the present disclosure. The cross-sectional views of FIGS. 17-19 are in a Y-Z plane. The 3D memory device 199 includes the 3D memory structure 198 shown in FIG. 16, including the 3D array device 100 and the peripheral device 190, and the 3D array device 180 shown in FIG. 13. The peripheral device 190 is configured to control the memory device 199.

The 3D memory structure 198 and the array device 180 are bonded by the flip-chip bonding method to form the 3D memory device 199, as shown in FIG. 17. In some aspects, the 3D array device 180 is flipped vertically and becomes upside down with the top surfaces of the connecting pads 187-188 facing downward in the Z direction. Then, the 3D array device 180 is placed above the memory structure 198, with the connecting pads 188 aligned with the connecting pads 117, respectively. Then, the 3D array device 180 and memory structure 198 are joined and bonded together. The layer stacks 146 of the array devices 180 and 100 become sandwiched between the doped regions 111 of the array devices 180 and the peripheral device 190. In some aspects, a solder or a conductive adhesive is used to bond the connecting pads 188 with the connecting pads 117, respectively. As such, the connecting pads 188 are connected to the connecting pads 117. The 3D array device 180 and peripheral device 190 are in electrical communication after the flip-chip bonding process is completed.

After the flip-chip bonding, the substrate 110 of the 3D array device 180 is thinned by a thinning process. A dielectric layer 118 is formed over the doped region 111 by a deposition process. As shown in FIG. 18, an opening 122 is made by, e.g., a dry etch process or a combination of dry and wet etch processes. The opening 122 may also be considered as a trench in some aspects. The opening 122 penetrates through the dielectric layer 118, the doped region 111, and the dielectric layer 121 of the array device 180, and partially through the dielectric layer 112 of the array device 100, exposing the conductor layers 116 at the bottom of the opening 122. The opening 122 may be beside the interconnect contacts 182, or on a side of the staircase structure or the layer stack 146.

Over the interconnect contacts 182, openings 123 are formed to expose the interconnect contacts 182 by a dry etch or a combination of dry and wet etch. As shown in FIG. 18, the openings 123 pass through the dielectric layer 118 and the doped region 111. A deposition process such as CVD or PVD is performed to deposit a dielectric layer (e.g., a silicon oxide or silicon nitride layer) on the sidewall and bottom of the openings 123. After the dielectric layer at the bottom of the openings 123 is etched, a conductive material is filled in the openings to form vias 124, which are isolated from the doped region 111 and connected to the interconnect contacts 182, respectively.

Further, contact pads 125 and conductor layers 126 and 127 are formed by a deposition process such as CVD, PVD, ALD, electroplating, electroless plating, or a combination thereof. In some aspects, the contact pads 125 and conductor layers 126 and 127 are formed at the same time with the same material. Alternatively, the contact pads 125 and conductor layers 126 and 127 may be formed separately with different materials. The conductive material for the contact pads 125 and conductor layers 126 and 127 may include, for example, W, Co, Cu, Al, or a combination thereof. As shown in FIG. 19, the conductor layers 126 and 127 are arranged over the vias 124 and the semiconductor layer 131, respectively. The conductor layers 126 contact the vias 124. The contact pads 125 are configured for connection between the 3D memory device 199 and another device, and bonding wires may be bonded on the contact pads 125. Optionally, a single contact pad (not shown), instead of multiple contact pads (e.g., the contact pads 125), may be made over the conductor layers 116.

The contact pads 125 are formed on the 3D array device 100 in the opening 122. Laterally, the contact pads 125 are surrounded by the dielectric layer 112, beside the interconnect contacts 172 and 182, and on a side of the staircase structures and the layer stacks 146 of the array devices 100 and 180. In the vertical direction, the contact pads 125 are formed on the dielectric layer 112 and over and connected to the conductor layers 116 and the interconnect contacts 173. The contact pads 125 are connected to the peripheral device 190 through the interconnect contacts 173 and the connecting pads 195. Also along the vertical direction, the contact pads 125 are disposed between levels of the layer stacks 146 of the array devices 100 and 180 with respect to the array device 100 or the peripheral device 190, between levels of NAND memory cells of the array devices 100 and 180 with respect to the array device 100 or the peripheral device 190, or between the array device 180 and the peripheral device 190. As used herein, a level of the layer stack 146 of the array device 180 with respect to the array device 100 or the peripheral device 190 indicates an X-Y plane that passes through the layer stack 146. Similarly, a level of the NAND memory cells of the array device 180 with respect to the array device 100 or the peripheral device 190 indicates an X-Y plane that passes through the NAND memory cells of the array device 180. Similarly, a level of the contact pads 125 with respect to the array device 100 or the peripheral device 190 indicates an X-Y plane that passes through the contact pads 125. The height of a level, i.e., the height of an X-Y plane at the level, is measured against the Z axis. Further, the contact pads 125 may be disposed at a level below the connecting pads 187-188 or below the array device 180 with respect to the array device 100 or the peripheral device 190. For example, the opening 122 may reach a level below the doped region 111 of the array device 100 and the contact pads may be formed at a level below the doped region 111 of the array device 100.

As used herein, the term "proximate to" is a spatially relative term used to describe disposition of one material, element, feature, region, or sub-region near to another one of material, element, feature, region, or sub-region. The term "proximate to" includes dispositions of indirectly adjacent to, directly adjacent to, and internal to. For example, when the bottom of the opening 122 and the contact pads 125 are arranged proximate to the level of the connecting pads 187-188 with respect to the array device 100 or the peripheral device 190, it indicates that the bottom of the opening 122 and the contact pads 125 are arranged closer to the level of the connecting pads 187-188 than the level of the doped region 111 of the array device 180.

In some aspects, the bottom of the opening 122 and the contact pads 125 may be arranged proximate to the level of the connecting pads 187-188 with respect to the array device 100 or the peripheral device 190. For example, the bottom of the opening 122 and the contact pads 125 may be arranged proximate to and above or below the level of the connecting pads 187-188 with respect to the array device 100 or the peripheral device 190. Optionally, the bottom of the opening 122 and the contact pads 125 may also be arranged at a level between the connecting pads 187-188 and a midpoint of the layer stack 146 of the array device 180 along the Z axis. In such cases, the conductor layers 116 are not exposed at the bottom of the opening 122. Additional contacts (not shown) may be made that extend through the dielectric layer 121 of the array device 180 and the dielectric 112 to reach and contact the conductor layers 116. Then, the contact pads 125 may be formed over and contacting the additional contacts. As such, the contact pads 125 may be at the level of the connecting pads 187-188 with respect to the array device 100 or the peripheral device 190, or at a level between the connecting pads 187-188 and a midpoint of the layer stack 146 of the array device 180 along the Z axis.

Further, a dielectric material is deposited to cover the conductor layers 126 and 127 and thickens the dielectric layer 118. Over the 3D memory device 199, another dielectric layer 128 is formed that covers the layer 118, the contact pads 125, and the sidewall of the opening 122. The dielectric layer 128 serves as a passivation layer that may include a material such as silicon oxide, silicon nitride, silicon oxynitride, tetraethyl orthosilicate (TEOS), or a combination thereof. A deposition process such as CVD or PVD may be performed. Next, a dry etch process or dry and wet etch processes is performed to remove a portion of the dielectric layer 128 at the bottom of the opening 122 to expose the contact pads 125, as shown in FIG. 19.

Thereafter, other fabrication steps or processes are performed to complete fabrication of the 3D memory device 199. Details of the other fabrication steps or processes are omitted for simplicity.

As shown in FIG. 19, the contact pads 125 are arranged on the array device 100 and connected to the peripheral device 190 through the interconnect contacts 173 arranged in the array device 100. If the contact pads 125 are formed on the array device 180, the contact pads will be connected to the peripheral device 190 through interconnect contacts arranged in both the array devices 100 and 180. In that case, the interconnect contacts positioned beneath the contact pads 125 in both array devices 100 and 180 incurs additional parasitic capacitance that will affect the high-speed operation of the 3D memory device 199. Hence, by placing the contact pads 125 on the array device 100, the performance of the 3D memory device 199 can be enhanced.

In addition, if the opening 122 does not exist, hydrogen may only diffuse through the top layers such as the layers 128 and 118 and the doped region 111 of the array device 180, which is illustrated schematically by arrow dashed lines starting from the layer 128 in FIG. 19. In such a scenario, polysilicon of the semiconductor layer 131 of the array device 180 may receive enough hydrogen for defect repair. However, polysilicon of the semiconductor layer 131 of the array device 100 may not get enough hydrogen for defect repair. When the opening 122 is sufficiently close to the array device 100, hydrogen may diffuse through the sidewall of the opening 122 to reach the semiconductor layer 131 of the array device 100, as shown schematically by arrow dashed lines starting from the sidewall of the opening 122 in FIG. 19. As such, polysilicon of the semiconductor layer 131 of the array device 100 may get enough hydrogen for defect repair. The quality and yield of the 3D memory device 199 may be improved.

In some aspects, one or more additional openings (not shown) are formed in regions with no functional structure such as a dielectric region above the dielectric layer 112. The additional openings may expose the array device 100. Optionally, the additional openings may be formed when the opening 122 is fabricated. The additional openings may also be additional trenches. In some aspects, the additional openings are arranged around the opening 122 and/or around the layer stack 146. Optionally, some of the additional openings may be merged with the opening 122 to form a larger opening. In certain aspects, some of the additional openings penetrate through the dielectric layer 118, the doped region 111, and the dielectric layer 121 of the array device 180, and partially through the dielectric layer 112 of the array device 100. The additional openings further improve the diffusion of hydrogen, the quality, and the yield of the 3D memory device 199. The additional openings are filled with a dielectric material (e.g., silicon nitride) to form additional dielectric regions after a hydrogen diffusion process is completed. The additional dielectric regions are over and may be connected with the array device 100.

In some aspects, the array devices 100 and 180 are bonded to form an array device stack, but the peripheral device 190 is mounted beside the array device stack. In this case, the peripheral device 190 may be connected, e.g., via a printed circuit board (PCB), to the array devices 100 and 180. For example, the array device 100 may be mounted on a PCB and the array device 180 may be bonded with the array device 100 in a similar manner to that illustrated above. The array devices 100 and 180 may form an array device stack similar to part of the device 199 shown in FIG. 19. Further, similar to the configuration shown in FIG. 19, an opening may be formed on the device 180 and contact pads may be made at the bottom of the opening. Thus, the parasitic capacitance may be reduced and the performance may be improved.

Figure 20:
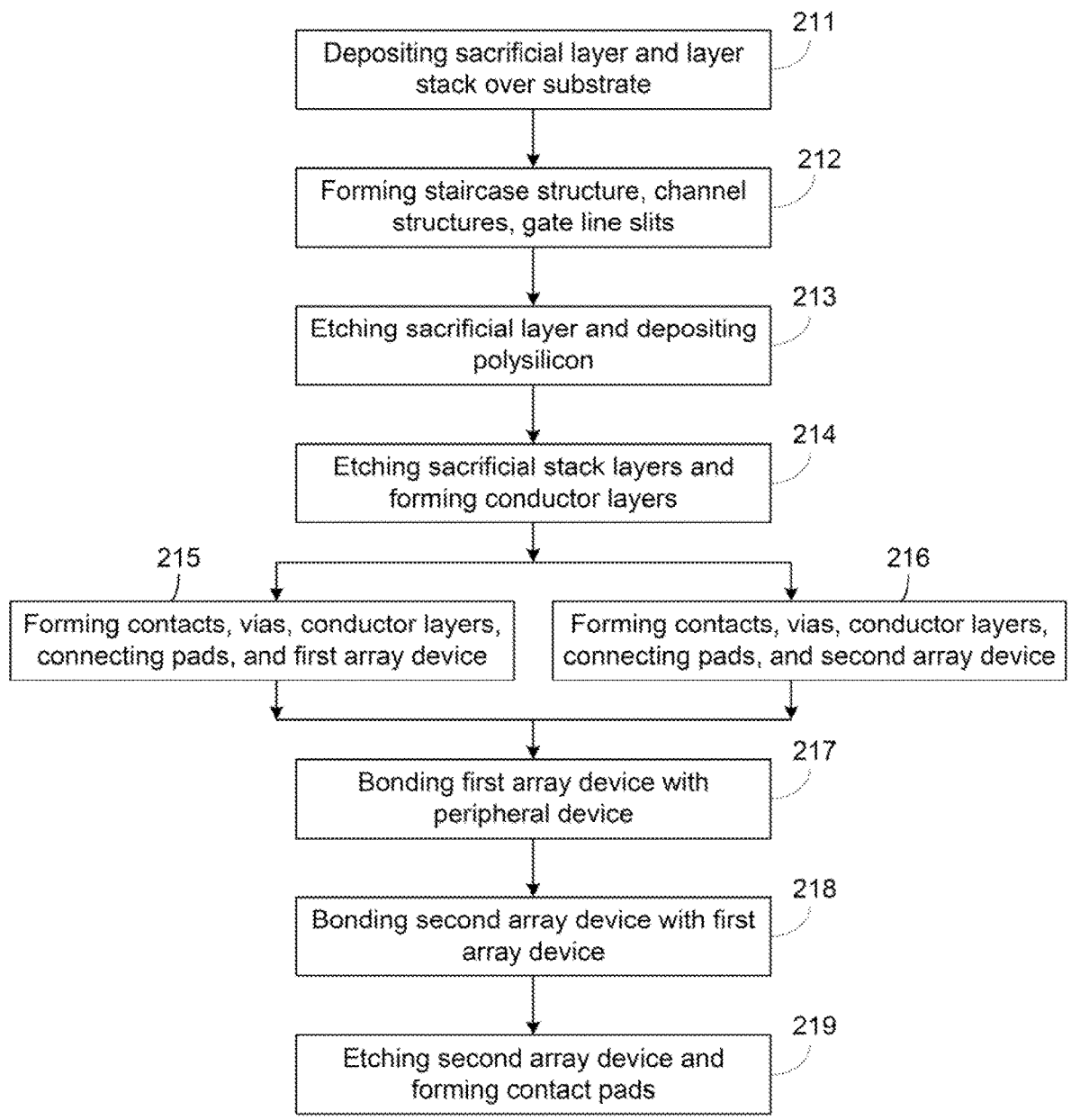
FIG. 20 illustrates a schematic flow chart of fabrication of a 3D memory device according to various aspects of the present disclosure.

FIG. 20 shows a schematic flow chart 200 for fabricating a 3D memory device according to aspects of the present disclosure. At 211, a sacrificial layer is deposited over a top surface of a substrate for a 3D array device. The substrate includes a semiconductor substrate, such as a single crystalline silicon substrate. In some aspects, a cover layer is grown on the substrate before depositing the sacrificial layer. The cover layer includes a single layer or multiple layers that are grown sequentially over the substrate. For example, the cover layer may include silicon oxide, silicon nitride, and/or aluminum oxide. In some other aspects, the sacrificial layer may be deposited without first depositing the cover layer over the substrate. The sacrificial layer may include single crystalline silicon, polysilicon, silicon oxide, or silicon nitride.

Over the sacrificial layer, a layer stack of the 3D array device is fabricated. The layer stack includes a first stack layer and a second stack layer that are alternately stacked. The first stack layer includes a first dielectric layer and the second stack layer includes a second dielectric layer that is different than the first dielectric layer. In some aspects, one of the first and second dielectric layers is used as a sacrificial stack layer.

At 212, a staircase formation process is performed to convert a portion of the layer stack into a staircase structure. The staircase formation process includes multiple etches that are used to trim the portion of the layer stack into the staircase structure. A deposition process is performed to deposit a dielectric layer to cover the staircase structure. A part of the dielectric layer on a side of the staircase structure is used as a contact region where interconnect contacts for contact pads or an opening for contact pads are configured.

Further, channel holes are formed that extend through the layer stack and the sacrificial layer to expose portions of the substrate. A functional layer and a channel layer are deposited on the sidewall and bottom surface of each channel hole. Forming the functional layer includes depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel.

Further, gate line slits of the 3D array device are formed. Along the vertical direction, the gate line slits extend through the layer stack. After the gate line slits are etched, portions of the sacrificial layer are exposed.

At 213, the sacrificial layer is etched away and a cavity is created above the substrate. The cavity exposes a bottom portion of the blocking layer of the functional layer in the cavity. The cover layer is also exposed in the cavity, if it is deposited on the substrate. The layers of the functional layer exposed sequentially in the cavity, including the blocking layer, the charge trap layer, and the tunnel insulation layer, are etched away, respectively. As a result, a portion of the functional layer that is close to the substrate is removed in the cavity. The cover layer, if deposited, is also etched away during the process to etch the portion of the functional layer or in another selective etch process. Hence, a portion of the substrate and portions of the channel layers are exposed in the cavity.

Thereafter, a deposition process is performed to grow a semiconductor layer such as a polysilicon layer in the cavity. The semiconductor layer contacts the channel layers and the substrate.

In some aspects, the layer stack includes two dielectric stack layers and one of the stack layers is sacrificial. The sacrificial stack layers are etched away at 214 to leave cavities, which are then filled with a conductive material to form the conductor layers.

Further, a dielectric layer is deposited on the side walls and bottom surfaces of the gate line slits. Portions of the dielectric layer on the bottom surfaces are etched out selectively to expose the semiconductor layer. Conductive materials, such as TiN, W, Cu, Al, and/or doped polysilicon are deposited in the gate line slits to form an array common source that contacts the semiconductor layer.

After 214, etching and deposition processes are performed to form word line contacts, interconnect contacts, vias, conductor layers, and connecting pads at 215. The 3D array device becomes a first array device.

After 214, etching and deposition processes are performed to form word line contacts, interconnect contacts, vias, conductor layers, and connecting pads at 216. The 3D array device becomes a second array device.

At 217, a flip-chip bonding process is performed to bond the first array device and a peripheral device or fasten the first array device with the peripheral device to create a 3D memory structure. In some aspects, the first array device is flipped upside down and positioned above the peripheral device. The connecting pads of the first array device and the peripheral device are aligned and then bonded. After the substrate of the first array device is thinned, etching and deposition processes are performed to form vias, conductor layers, and connecting pads over the interconnect contacts in the contact region of the first array device.

At 218, flip-chip bonding is performed to bond the second array device and the first array device of the 3D memory structure to form a 3D memory device. In some aspects, the second array device is flipped upside down and positioned above the first array device. The connecting pads on the first and second array devices are aligned and then bonded. After the bonding process, the substrate of the second array device is thinned, and a dielectric layer is deposited.

At 219, an etch process is performed to form an opening that penetrates through the contact region of the second array device to expose conductor layers on the first array device. Further, etch and deposition processes are performed to form vias that are disposed over and connected to the interconnect contacts of the second array device. Thereafter, a deposition process is performed to form contact pads over the exposed conductor layers of the first array device. The contact pads are configured for wire bonding for connection with other devices. Further, conductor layers are formed over the vias that are connected to the interconnect contacts of the second array device in the deposition process.

Figure 21:
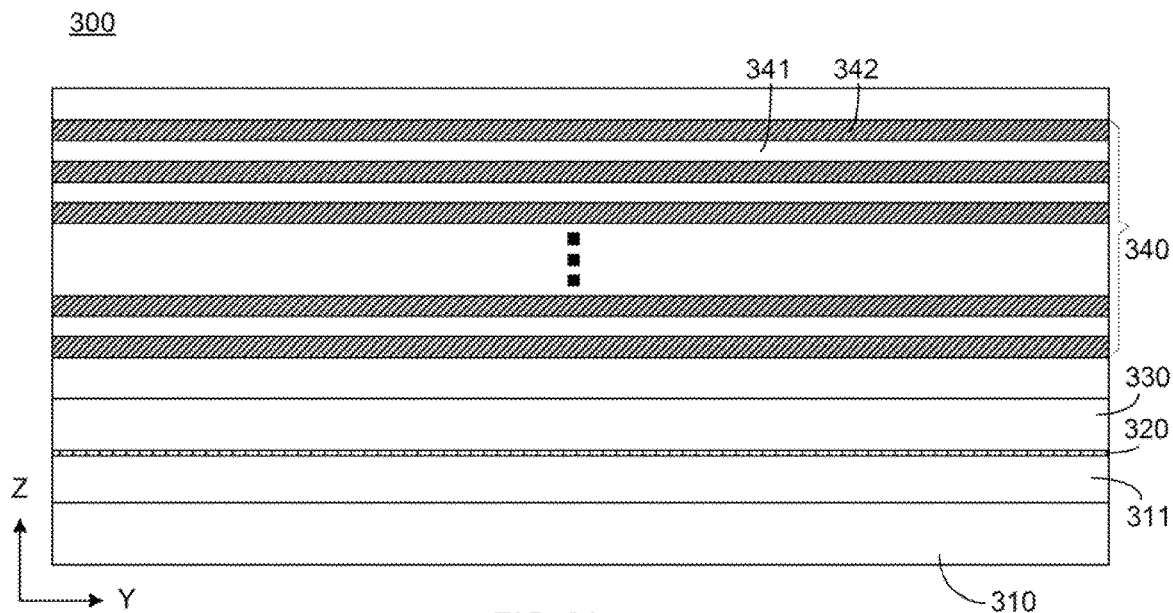
FIGS. 21 and 22 illustrate cross-sectional views of an exemplary 3D array device at certain stages during a fabrication process according to various aspects of the present disclosure.

FIGS. 21-24 schematically show a fabrication process of an exemplary 3D array device 300 according to aspects of the present disclosure. Among FIGS. 21-24, the cross-sectional views are in a Y-Z plane. As shown in FIG. 21, the 3D array device 300 includes a substrate 310. The substrate 310 includes a semiconductor layer, e.g., an undoped or lightly doped single crystalline silicon layer. In some aspects, a top portion of the substrate 310 is doped by n-type dopants to form a doped region 311. A cover layer 320 is deposited over the doped region 311. The cover layer 320 is a sacrificial layer and may include a single layer or multiple layers. For example, the cover layer 320 may include one or more of silicon oxide layer and silicon nitride layer. The cover layer 320 is deposited by CVD, PVD, ALD, or a combination thereof. Alternatively, the cover layer 320 may include another material such as aluminum oxide.

Over the cover layer 320, a sacrificial layer 330 is deposited. The sacrificial layer 330 includes a semiconductor material or dielectric material. In descriptions bellow, as an example, the sacrificial layer 330 is a polysilicon layer. After the sacrificial layer 330 is formed, a layer stack 340 is deposited. The layer stack 340 includes multiple pairs of stack layers 341 and 342, i.e., the stack layers 341 and 342 are stacked alternately.

In some aspects, the stack layers 341 and 342 include a first dielectric layer and a second dielectric layer that is different from the first dielectric layer. The alternating stack layers 341 and 342 may be deposited via CVD, PVD, ALD, or any combination thereof. In descriptions bellow, materials for the stack layers 341 and 342 (i.e., the first and second dielectric layers) are silicon oxide and silicon nitride, respectively. The silicon oxide layer is used as an isolation stack layer and the silicon nitride layer is used as a sacrificial stack layer.

Figure 22:
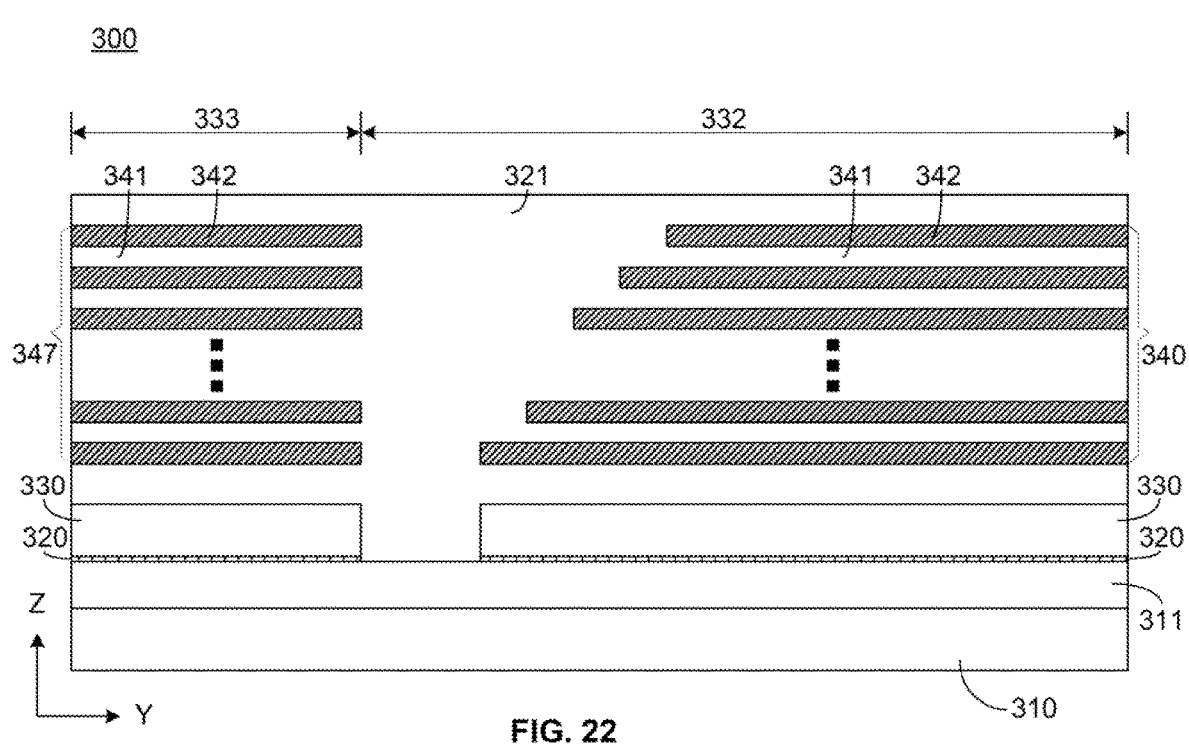

Further, a staircase formation process is performed to trim a part of the layer stack 340 into a staircase structure in a channel hole region 332. The staircase structure is covered by a dielectric material such as silicon oxide that forms a dielectric layer 321. During the staircase formation process, the stack layers 341 and 342, the cover layer 320, and the sacrificial layer 330 in a contact region 333 remain unchanged. The contact region 333 of the 3D array device 300 is configured for interconnect contacts for contact pads or an opening for contact pads. The stack layers 341 and 342 in the contact region 333 form a layer stack 347 over the remaining sacrificial layer 330 and the remaining cover layer 320, as shown in FIG. 22. The layer stack 347 contains the stack layers 341 and 342, i.e., the alternating first and second dielectric layers and forms a dielectric region with the dielectric layer 321. Horizontally, the layer stack 347 is on a side of the staircase structure and the layer stack 346, e.g., on the left side of the staircase structure, and the staircase structure is between the layer stacks 340 and 347. The staircase structure and the layer stack 347 are separated by a portion of the dielectric layer 321 that is deposited over the doped region 311.

Figure 23:
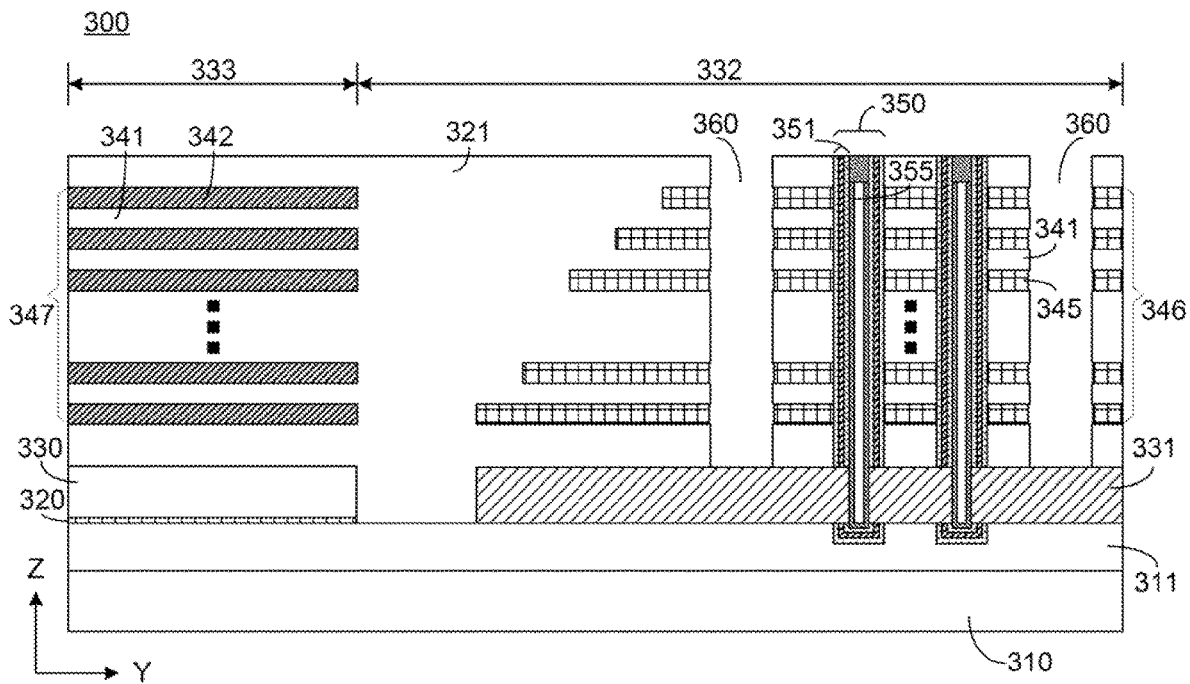
FIGS. 23 and 24 illustrate cross-sectional views of the 3D array device shown in FIG. 22 at certain stages in the fabrication process according to various aspects of the present disclosure.

FIG. 23 shows a schematic cross-sectional view of the 3D array device 300 at a certain stage according to aspects of the present disclosure. After the layer stack 340 is made, channel holes 350 are formed. The quantity, dimension, and arrangement of the channel hole 350 shown in FIG. 23 are exemplary and for description of structures and fabrication methods.

The channel holes 350 may have a cylinder shape or pillar shape that extends through the layer stack 340, the sacrificial layer 330, and the cover layer 320, and partially penetrates the doped region 311. After the channel holes 350 are formed, a functional layer 351 is deposited on the sidewall and bottom of the channel hole. The functional layer 351 includes a blocking layer on the sidewall and bottom of the channel hole, a charge trap layer on a surface of the blocking layer, and a tunnel insulation layer on a surface of the charge trap layer.

In some aspects, the functional layer 351 includes the ONO structure, which is used in descriptions below. For example, a silicon oxide layer is deposited as the blocking layer, a silicon nitride layer is deposited as the charge trap layer, and another silicon oxide layer is deposited as the tunnel insulation layer. On the tunnel insulation layer, a polysilicon layer is deposited as a channel layer 355. Like the channel holes, the channel layer 355 also extends through the layer stack 340 and into the doped region 311. The channel holes 350 are filled by an oxide material after the channel layers 355 are formed. The channel hole 350 is sealed by a plug that includes a conductive material (e.g., metal W) and contacts the channel layer 355.

Further, gate line slits 360 are formed by a dry etch process or a combination of dry and wet etch processes. The gate line slits 360 extends through the layer stack 340 and reaches or partially penetrates the sacrificial layer 330 in the Z direction. As such, at the bottom of the gate line slits 360, parts of the sacrificial layer 330 are exposed. Spacer layers (not shown) are deposited on the sidewall and bottom of the gate line slit 360, and portions of the spacer layers at the bottom of the slits 360 are removed by etch to expose the sacrificial layer 330 again. The sacrificial layer 330 is etched out. Removal of the sacrificial layer 330 creates a cavity and exposes the cover layer 320 and bottom portions of the blocking layers formed in the channel holes 350. Portions of the blocking layer, the charge trap layers, and the tunnel insulation layer are etched away, exposing bottom portions of the channel layer 355. The cover layer 320 is removed when the bottom portions of the functional layer 351 are etched away or in an additional selective etch process, exposing a top surface of the doped region 311.

The cavity is filled by a semiconductor material, e.g., polysilicon, to form a semiconductor layer 331. The semiconductor layer 331 is deposited on surfaces of the exposed portions of the doped region 311 and the channel layer 355. Further, the sacrificial stack layers 342 are removed by etch and replaced by conductor layers 345 that include a conductive material such as W. The layer stack 340 becomes a layer stack 346 after the conductor layers 345 are formed, as shown in FIG. 23. The layers stack 346 contains alternating stack layers 341 and 345. The stack layers 341 of the layer stacks 346 and 347 are the same, since the layers 341 of both stacks are formed with the same material at the same time.

In the layer stack 346, each conductor layer 345 is configured to electrically connect one or more rows of NAND memory cells along the Y direction or in the X-Y plane and is configured as a word line for the 3D array device 300. The channel layer 355 formed in the channel hole 350 is configured to electrically connect a NAND string along the Z direction and configured as a bit line for the 3D array device 300.

The gate line slits 360 are filled with a conductive material 361 (e.g., doped polysilicon) and a conductive plug 362 (e.g., with metal W). In some aspects, the filled gate line slits become an array common source for the 3D array device 300.

Figure 24:
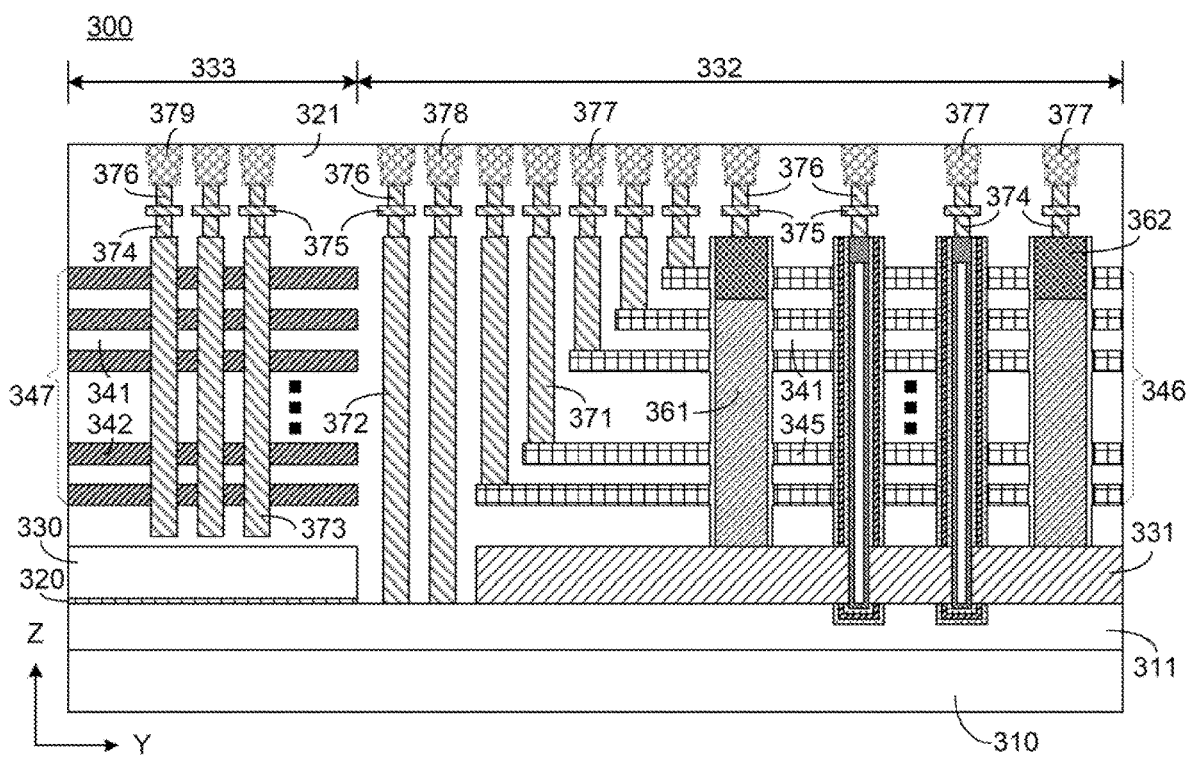

Thereafter, openings for word line contacts 371 and interconnect contacts 372 and 373 are formed. The openings are filled with a conductive material (e.g., W, Co, Cu, Al, or any combination thereof) to form the contacts 371-373, respectively. As shown in FIG. 24, the interconnect contacts 373 are formed in the contact region 333 and on a side of the staircase structure. The staircase structure is between the contacts 372-373 and the layer stack 346. The interconnect contacts 373 extend through the layer stack 347 and reach a level between the layer stack 347 and the sacrificial layer 330. As such, the interconnect contacts 373 and the sacrificial layer 330 are electrically isolated by a portion of the dielectric layer 321. In some aspects, the interconnect contacts 372 are disposed between the contacts 373 and the staircase structure, extending to reach the doped region 311 vertically. Alternatively, the interconnect contacts 372 may extend to a level above the doped region 311 in the dielectric layer 321. In some other aspects, the interconnect contacts 372 pass through the layer stack 347 and extend to a level between the layer stack 347 and the sacrificial layer 330. The interconnect contacts 372 and 373 are arranged in a dielectric region containing the layer stack 347 and the dielectric layer 321, and the dielectric region is beside the layer stack 346 and NAND memory cells of the array device 300 with respect to the substrate 310.

Similar to the formation of the vias 174, the conductor layers 175, and the vias 176 of the array device 100, etch and deposition processes are performed to form vias 374, conductor layers 375, and vias 376. A conductive material such as W, Co, Cu, Al, or a combination thereof may be used. The vias 374 and 376 and conductor layers 375 are connected to the contacts 371-373, the plugs 362, and the upper ends of corresponding NAND strings, respectively.

Further, similar to the formation of the connecting pads 177-179, etch and deposition processes are performed to fabricate connecting pads 377, 378, and 379. A conductive material such as W, Co, Cu, Al, or a combination thereof may be used. The connecting pads 377 are connected to the word line contacts 371, the plugs 362, and the upper ends of corresponding NAND strings, respectively. The connecting pads 378-379 are connected to the interconnect contacts 372-373, respectively.

Figure 25:
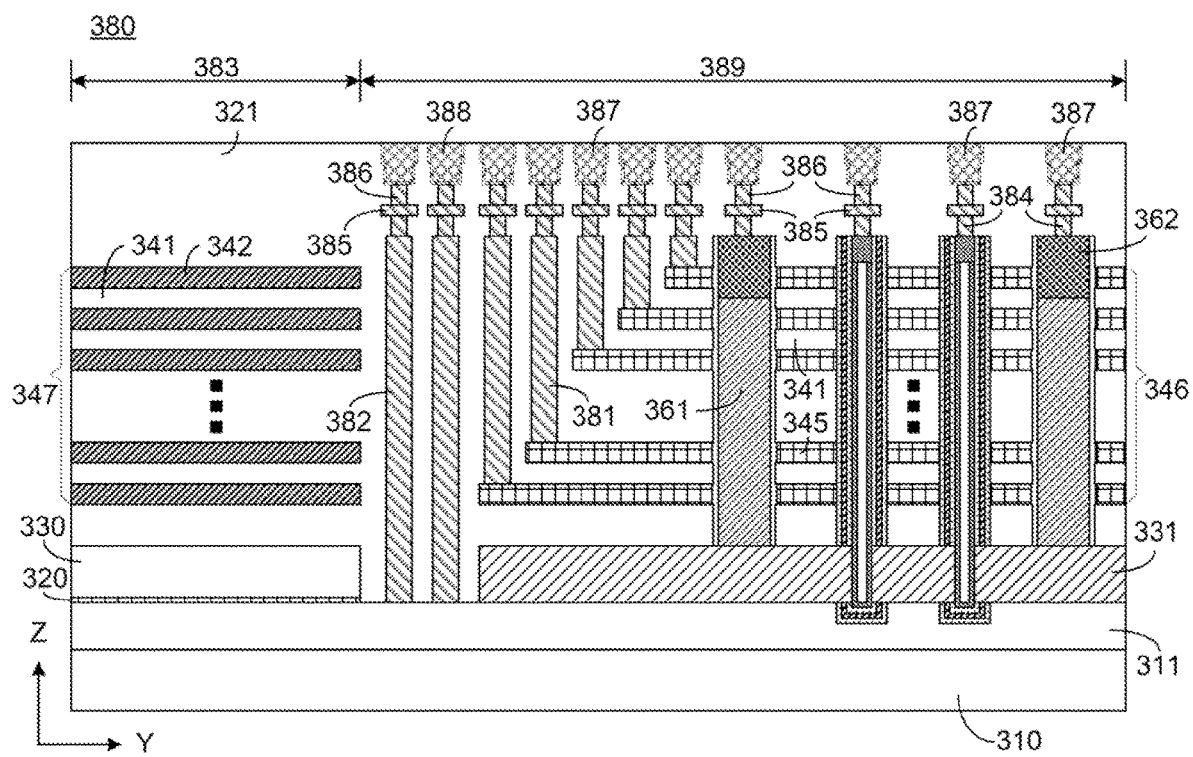
FIG. 25 illustrates a cross-sectional views of another exemplary 3D array device at a certain stage of a fabrication process according to various aspects of the present disclosure.

Referring to FIG. 23, after the gate line slits 360 are filled with the conductive material 361 and the conductive plug 362, word line contacts 381 and interconnect contacts 382 are formed and the 3D array device 300 becomes a 3D array device 380. The formation of the contacts 381-382 may be similar to that of the contacts 371-372 of the array device 300. As shown in FIG. 25, the layer stack 347 is arranged in a contact region 383, and the interconnect contacts 381-382, the staircase structure, and the layer stack 346 are arranged in a channel hole region 389. A portion of the layer stack 347 in the contact region 383 is configured for an opening for contact pads. The layer stack 347 and a portion of the dielectric layer 321 form a dielectric region that is beside the layer stack 346 and the NAND memory cells. In some aspects, the interconnect contacts 382 extend to reach the doped region 311. Alternatively, the interconnect contacts 382 may extend to a level above the doped region 311 in the dielectric layer 321. In some other aspects, the interconnect contacts 382 may pass through the layer stack 347 and extend to a level between the layer stack 347 and the sacrificial layer 330. The conductive material of the contacts 381-382 may include W, Co, Cu, Al, or a combination thereof.

Similar to the formation of the vias 374, the conductor layers 375, and the vias 376 of the array device 300, etch and deposition processes are performed to form vias 384, conductor layers 385, and vias 386. A conductive material such as W, Co, Cu, Al, or a combination thereof may be used. The vias 384 and 386 and conductor layers 385 are connected to the contacts 381-382, the plugs 362, and the upper ends of corresponding NAND strings, respectively.

Thereafter, similar to the formation of the connecting pads 377-378, etch and deposition processes are performed to fabricate connecting pads 387 and 388. A conductive material such as W, Co, Cu, Al, or a combination thereof may be used. The connecting pads 387 are connected to the word line contacts 381, the plugs 362, and the upper ends of corresponding NAND strings, respectively. The connecting pads 388 are connected to the interconnect contacts 382, respectively.

Figure 26:
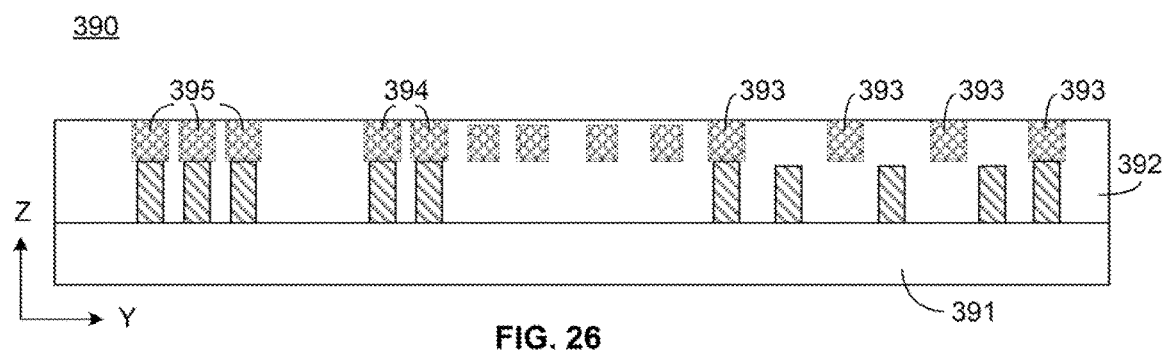
FIG. 26 illustrates a cross-sectional view of an exemplary peripheral device according to various aspects of the present disclosure.

FIG. 26 schematically shows a peripheral device 390 in a cross-sectional view according to aspects of the present disclosure. The peripheral device 390 includes a semiconductor substrate 391 (e.g., a substrate of single crystalline silicon). Peripheral CMOS circuits (e.g., control circuits) (not shown) are fabricated on the substrate 391 and used for facilitating the operation of the 3D array devices 300 and 380. A dielectric layer 392 including one or more dielectric materials is deposited over the substrate 391. Connecting pads such as connecting pads 393, 394, and 395 and vias are formed in the dielectric layer 392. The connecting pads 393-395 are configured for interconnecting with the 3D array device 300 and include a conductive material (e.g., W, Co, Cu, Al, or any combination thereof).

Figure 27:
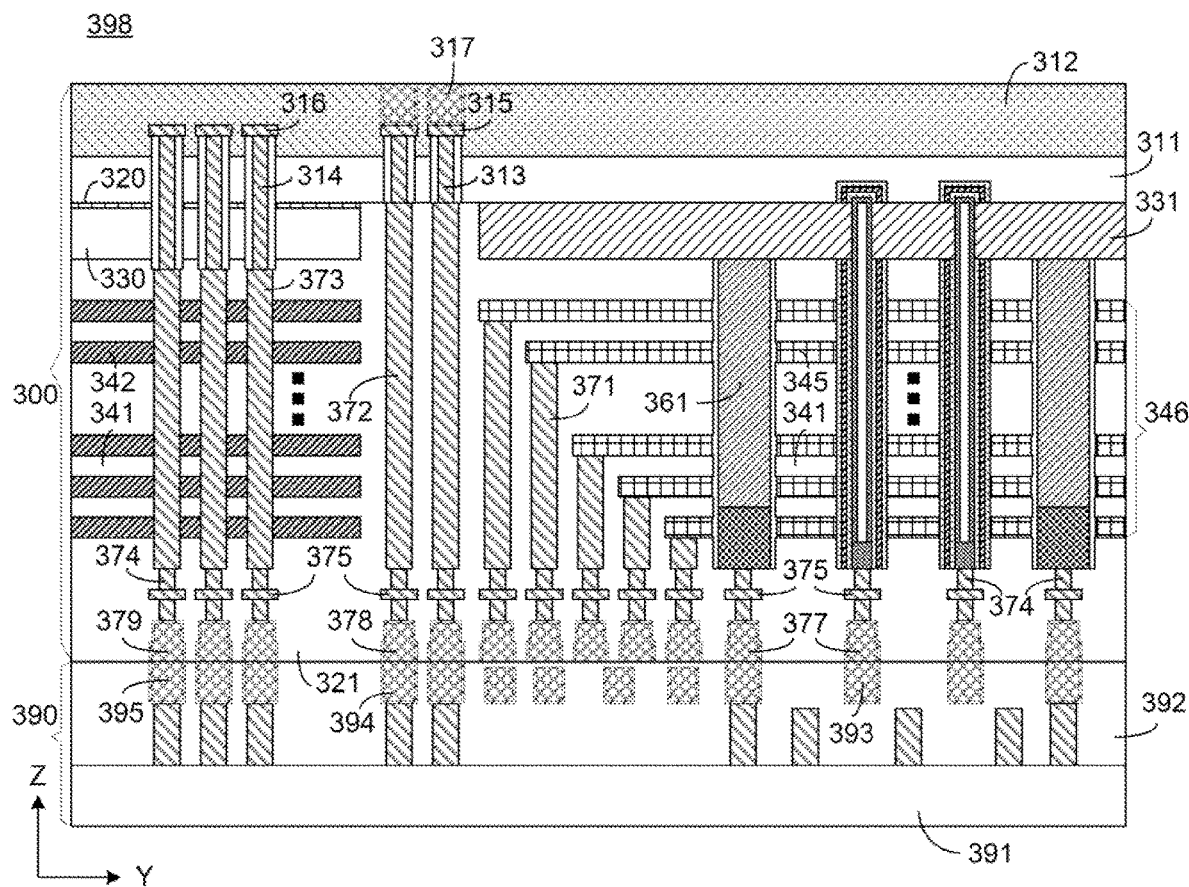
FIG. 27 illustrates a cross-sectional view of a 3D memory structure after the 3D array device shown in FIG. 24 is bonded with the peripheral device shown in FIG. 26 according to various aspects of the present disclosure.

FIG. 27 shows an exemplary 3D memory structure 398 at a certain stage in a fabrication process according to aspects of the present disclosure. The cross-sectional view of FIG. 27 is in a Y-Z plane. The 3D memory device 398 is formed by bonding the 3D array device 300 shown in FIG. 24 and the peripheral device 390 shown in FIG. 26 in a flip-chip bonding process.

In some aspects, the 3D array device 300 is flipped vertically and become upside down over the peripheral device 390. After an alignment is made, e.g., the connecting pads 377-379 are aligned with the connecting pads 393-395, respectively, the 3D array device 300 and peripheral device 390 are joined and bonded together face to face. The layer stack 346 and the peripheral CMOS circuits become sandwiched between the doped region 311 and the substrate 391. In some aspects, a solder or a conductive adhesive is used to bond the aligned connecting pads. As such, the connecting pads 377-379 are connected to the connecting pads 393-395, respectively. The 3D array device 300 and peripheral device 390 are in electrical communication after the flip-chip bonding process is completed.

Thereafter, the substrate 310 of the 3D array device 300 is thinned by a thinning process. A dielectric layer 312 is grown over the doped region 311 by deposition. Similar to the formation of the vias 113-114, conductor layers 115-116, and connecting pads 117, etch and deposition processes are performed to form vias 313 and 314, conductor layers 315 and 316, and connecting pads 317, respectively. As the vias 313 pass through the doped region 311 and the vias 314 pass through the doped region 311 and sacrificial layer 330, dielectric layers are grown on sidewalls of openings before the openings are filled with a conductive material to form the vias 313 and 314. The conductor layers 316 may also be referred to as conductor elements and are formed over and connected to the vias 314 and the interconnect contacts 373. The connecting pads 317, formed over and connected to the conductor layers 315 and the interconnect contacts 372, are configured for connection between the 3D array devices 300 and 380.

Figure 28:
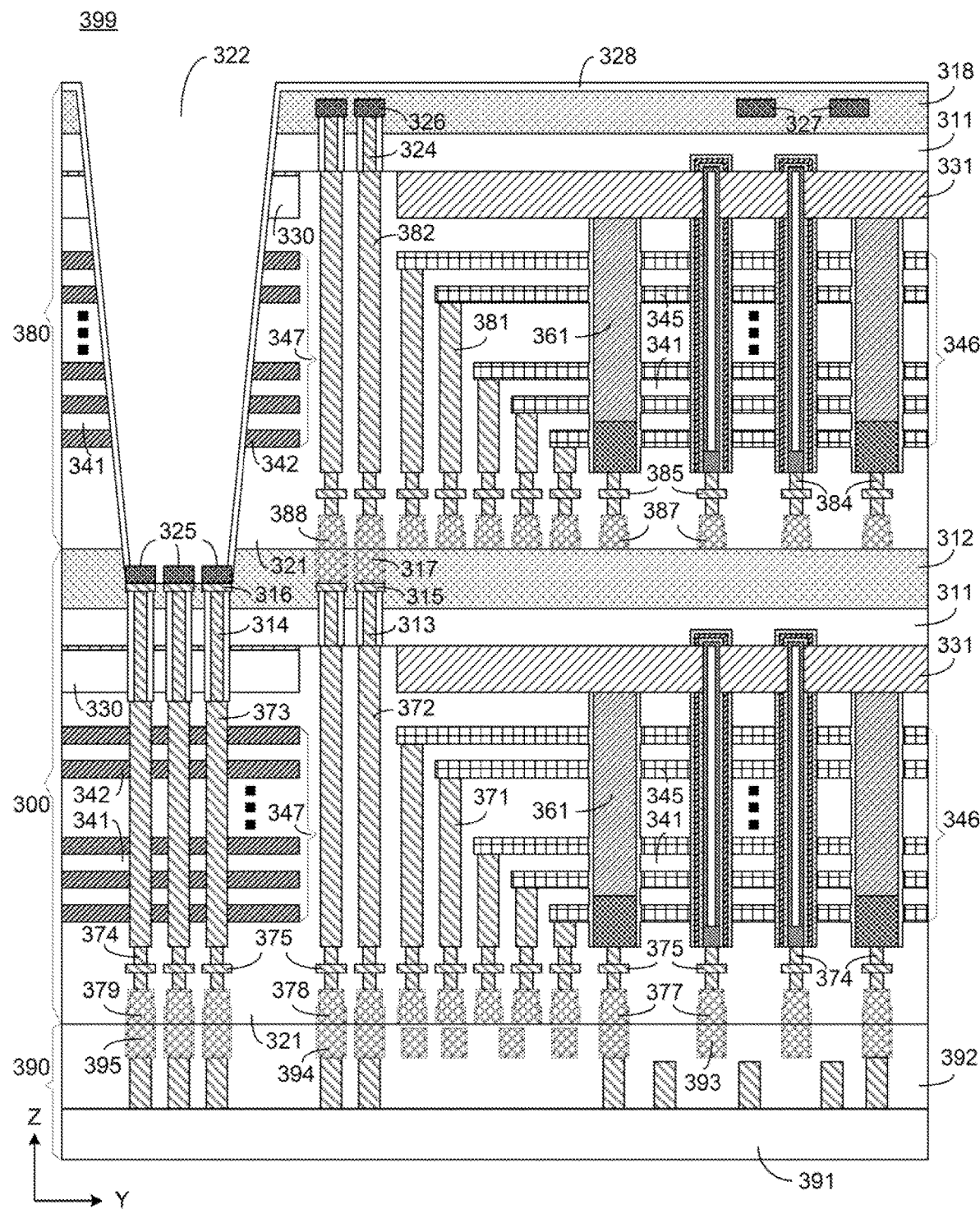
FIG. 28 illustrates a cross-sectional view of an exemplary 3D memory device after the 3D memory structure shown in FIG. 27 is bonded with the 3D array device shown in FIG. 25 according to various aspects of the present disclosure.

FIG. 28 shows an exemplary 3D memory device 399 at a certain stage of a fabrication process according to aspects of the present disclosure. The cross-sectional view of FIG. 28 is in a Y-Z plane. The 3D memory device 399 includes the 3D memory structure 398 shown in FIG. 27, which includes the 3D array device 300 and the peripheral device 390, and the 3D array device 380 shown in FIG. 25. The peripheral device 390 is configured to control the memory device 399.

The 3D memory structure 398 and the array device 380 are bonded by the flip-chip bonding method to form the 3D memory device 399, as shown in FIG. 28. In some aspects, the 3D array device 380 is flipped vertically and become upside down over the memory structure 398. After alignment, the 3D array device 380 and memory structure 398 are joined and bonded together. In some aspects, a solder or a conductive adhesive is used to bond the connecting pads 388 with the connecting pads 317. As such, the connecting pads 388 are connected to the connecting pads 317, respectively. The 3D array device 380 and peripheral device 390 are in electrical communication after the flip-chip bonding process is completed.

Further, the substrate 310 of the 3D array device 380 is thinned using a thinning method. A dielectric layer 318 is formed over the doped region 311 by a deposition process. As shown in FIG. 28, an opening 322 is made by, e.g., a dry etch process or a combination of dry and wet etch processes. The opening 322 may also be considered as a trench in some aspects. The opening 322 penetrates through the dielectric layer 318, the doped region 311, the cover layer 320, the sacrificial layer 330, the layer stack 347, and the dielectric layer 321 of the array device 380, and partially through the dielectric layer 312 of the array device 300, exposing the conductor layers 316 on the array device 300 at the bottom of the opening 322. The opening 322 is beside of the interconnect contacts 372 and 382, or on a side of the staircase structures and the layer stacks 346 with respect to the peripheral device 390. As the opening 322 passes through the layer stack 347 of the array device 380, after the opening 322 is made, a portion of the layer stack 347 is removed. The remaining portion of the layer stack 347 after the formation of the opening 322 may still be considered as the layer stack 347. The remaining layer stack 347 surrounds the opening 322 at least partially, and forms a dielectric region with the dielectric layer 321 beside the layer stack 346 and NAND memory cells of the array device 380.

Over the interconnect contacts 382, vias 324 are formed, in a manner similar to the formation of the vias 124 of the 3D memory device 199. A dielectric layer is formed between the vias 324 and the doped region 311 for isolation.

Further, contact pads 325 and conductor layers 326 and 327 are formed by a deposition process such as CVD, PVD, ALD, electroplating, electroless plating, or a combination thereof. The conductive material for the contact pads 325 and conductor layers 326 and 327 may include, e.g., W, Co, Cu, Al, or a combination thereof. As shown in FIG. 28, the conductor layers 326 and 327 are arranged over the vias 324 and the semiconductor layer 331, respectively. The conductor layers 326 are connected to the interconnect contacts 382 through the vias 324. The contact pads 325 are configured for connection between the 3D memory device 399 and other devices, and bonding wires may be bonded on the contact pads 325.

The contact pads 325 are formed on the 3D array device 300 inside the opening 322. Laterally, the contact pads 325 are surrounded by the dielectric layer 312, beside of the interconnect contacts 372 and 382, and on a side of the staircase structures and the layer stacks 346. In the vertical direction, the contact pads 325 are formed on the dielectric layer 312 and over and connected to the conductor layers 316 and the interconnect contacts 373. The contact pads 325 are connected to the connecting pads 395 of the peripheral device 390 through the interconnect contacts 373. Also along the vertical direction, the contact pads 325 are disposed between the layer stacks 347 of the array devices 300 and 380, and/or between the array device 380 and the peripheral device 390. The contact pads 325 may also be disposed between levels of the layer stacks 346, between levels of NAND memory cells of the array devices 300 and 380, or on a level below the array device 380 with respect to the peripheral device 390.

In some aspects, the opening 322 reaches a level below the doped region 311 of the array device 300, e.g., a place inside the layer stack 347 of the array device 300. For example, when the interconnect contacts 373 are made, the bottom of the contacts 373 may be arranged inside the layer stack 347. Optionally, the opening 322 may reach and expose the layer stack 347 of the array device 300 and the contact pads 325 may be formed over the ends of the contacts 373 inside the layer stack 347.

Thereafter, a passivation layer 328 is deposited by CVD or PVD, and other fabrication steps or processes are performed to complete fabrication of the 3D memory device 399. Details of the other fabrication steps or processes are omitted for simplicity.

As shown in FIG. 28, the contact pads 325 are formed on the array device 300. If the contact pads 325 are configured on the array device 380, interconnect contacts have to be made in both the array devices 380 and 300. Then parasitic capacitance may increase and affect the high-speed operation of the 3D memory device 399. Therefore, the contact pads 325 formed on the array device 300 may improve the performance of the device 399.

Similar to the opening 122 of the 3D memory device 199, the opening 322 may improve the hydrogen diffusion for polysilicon defect repair for the 3D memory device 399. In some aspects, one or more additional openings (not shown) are formed in regions with no functional structure such as a dielectric region above the dielectric layer 312. The additional openings may expose the array device 300. Optionally, the additional openings may be formed when the opening 322 is fabricated. The additional openings may also be additional trenches. In some aspects, the additional openings are arranged around the opening 322 and/or around the layer stack 346 or the NAND memory cells of the array device 380. Optionally, some of the additional openings may be merged with the opening 322 to form a larger opening. In certain aspects, some of the additional openings penetrate through the dielectric layer 318, the doped region 311, the layer stack 347, and the dielectric layer 321 of the array device 380, and partially through the dielectric layer 312 of the array device 300. The additional openings may further improve the diffusion of hydrogen, the quality, and the yield of the 3D memory device 399. The additional openings are filled with a dielectric material (e.g., silicon nitride) to form additional dielectric regions after a hydrogen diffusion process is completed. The additional dielectric regions are over and may be connected with the array device 300.

Although the principles and implementations of the present disclosure are described by using specific aspects in the specification, the foregoing descriptions of the aspects are only intended to help understand the present disclosure. In addition, features of aforementioned different aspects may be combined to form additional aspects. A person of ordinary skill in the art may make modifications to the specific implementations and application range according to the idea of the present disclosure. Hence, the content of the specification should not be construed as a limitation to the present disclosure.

What is claimed is:

1. A method for fabricating a three-dimensional (3D) memory device, comprising:
   providing a stacked device having a first array device and a second array device, wherein:
   the first array device includes a plurality of first front pads on a face side, a plurality of first back pads on a back side, and a plurality of interconnect contacts connected to part of the plurality of first front pads;

the second array device includes a plurality of second front pads on a face side of the second array device and bonded with the plurality of first back pads of the first array device;

forming an opening passing through the second array device and having a bottom in the first array device; and forming one or more contact pads disposed in the bottom of the opening, over and connected to one or more of the plurality of interconnect contacts of the first array device, and have a surface at a level proximate to an interface between the first and second array devices, wherein the first array device further includes a plurality of first memory cells, a dielectric layer, and a doped region formed between the dielectric layer and the plurality of first memory cells, the bottom of the opening is located in the dielectric layer of the first array device, and the one or more contact pads are formed at the bottom of the opening.

2. The method according to claim 1, wherein providing the stacked device further comprising:

before bonding the plurality of second front pads with the plurality of first back pads, forming one or more conductor elements disposed over and connected to the one or more of the plurality of interconnect contacts.

3. The method according to claim 2, wherein forming the one or more contact pads includes:

forming the one or more contact pads disposed over and connected to the one or more conductor elements.

4. The method according to claim 1, wherein the plurality of first memory cells is formed by performing:

forming a first layer stack including a plurality of first dielectric layers and a plurality of first conductor layers alternately stacked over each other; and forming the plurality of first memory cells through the first layer stack.

5. The method according to claim 4, further comprising:

forming a second layer stack beside the first layer stack, the second layer stack including a plurality of second dielectric layers and a plurality of third dielectric layers alternately stacked over each other, and a part of the plurality of interconnect contacts passing through the second layer stack.

6. The method according to claim 4, wherein forming the plurality of first memory cells through the first layer stack further including:

forming a functional layer extending through the first layer stack, the functional layer including a blocking layer, a charge trap layer, and/or a tunnel insulation layer; and forming a channel layer, the channel layer extending through the first layer stack and connecting a portion of the plurality of first memory cells, and the functional layer being between the channel layer and the first layer stack.

7. The method according to claim 1, further comprising:

forming one or more trenches around the opening and/or around a plurality of second memory cells of the second array device; and filling the one or more trenches with a dielectric material.

8. The method according to claim 1, further comprising:

bonding the plurality of first front pads with a plurality of third front pads on a face side of a peripheral device.

9. A three-dimensional (3D) memory device, comprising:

a stacked device having a first array device and a second array device, wherein:

the first array device includes a plurality of first front pads on a face side, a plurality of first back pads on a back side, and a plurality of interconnect contacts connected to part of the plurality of first front pads;

the second array device includes a plurality of second front pads on a face side of the second array device and bonded with the plurality of first back pads of the first array device; and an opening passing through the second array device and having a bottom in the first array device exposing one or more contact pads;

wherein the one or more contact pads are electrically connected to one or more of the plurality of interconnect contacts of the first array device, and have a surface at a level proximate to an interface between the first and second array devices, the first array device further includes a plurality of first memory cells, a dielectric layer, and a doped region formed between the dielectric layer and the plurality of first memory cells, the bottom of the opening is located in the dielectric layer of the first array device, and the one or more contact pads are formed at the bottom of the opening.

10. The 3D memory device according to claim 9, further comprising:

one or more conductor elements disposed between and connected to the one or more contact pads and the one or more of the plurality of interconnect contacts.

11. The 3D memory device according to claim 9, wherein:

the second array device includes a dielectric region and a dielectric-conductor layer stack adjacent to the dielectric region, over the first array device, and the opening is formed through the dielectric region of the second array device.

12. The 3D memory device according to claim 9, wherein the first array device further includes:

a first layer stack including a plurality of first dielectric layers and a plurality of first conductor layers alternately stacked over each other, the plurality of first memory cells disposed through the first layer stack.

13. The 3D memory device according to claim 12, wherein the first array device further includes:

a second layer stack beside the first layer stack, the second layer stack including a plurality of second dielectric layers and a plurality of third dielectric layers alternately stacked over each other, at least a part of the plurality of interconnect contacts passing through the second layer stack.

14. The 3D memory device according to claim 12, wherein the first array device further includes:

a channel layer, extending through the first layer stack and connecting a portion of the plurality of first memory cells; and a functional layer, extending through the first layer stack and formed between the channel layer and the first layer stack, the functional layer including a blocking layer, a charge trap layer, and/or a tunnel insulation layer.

15. The 3D memory device according to claim 11, further comprising:
- a dielectric-dielectric layer stack formed in the dielectric region of the second array device, and
- the opening is formed through the dielectric-dielectric layer stack of the dielectric region of the second array device.

16. The 3D memory device according to claim 9, wherein:
- a peripheral device electrically connected to the first array device, wherein the one or more contact pads further electronically connected to the peripheral device via the one or more interconnect contacts.

17. A three-dimensional (3D) memory device, comprising:
- a stacked device having a first array device and a second array device, wherein:
- the first array device includes a plurality of first front pads on a face side, a plurality of first back pads on a back side, and a plurality of interconnect contacts connected to part of the plurality of first front pads; and
- the second array device includes a plurality of second front pads on a face side of the second array device and bonded with the plurality of first back pads of the first array device;
- one or more contact pads at a bottom of an opening, the opening passing through an entire thickness of the second array device, and connecting to one or more of the plurality of interconnect contacts; and
- a first dielectric layer formed on sidewall of the opening through the second array device and on a surface portion of the one or more contact pads
- the first array device further includes a plurality of first memory cells, a second dielectric layer, and a doped region formed between the second dielectric layer and the plurality of first memory cells,
- the bottom of the opening is located in the second dielectric layer of the first array device, and
- the one or more contact pads are formed at the bottom of the opening.

* * * * *